US012755079B2

(12) United States Patent
Peng et al.

(10) Patent No.: US 12,755,079 B2
(45) Date of Patent: Oct. 6, 2026

(54) SEMICONDUCTOR DEVICE LAYOUT

(71) Applicant: Taiwan Semiconductor Manufacturing Company, Ltd., Hsinchu (TW)

(72) Inventors: Shih-Wei Peng, Hsinchu (TW); Te-Hsin Chiu, Hsinchu (TW); Jiann-Tyng Tzeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 680 days.

(21) Appl. No.: 17/538,028

(22) Filed: Nov. 30, 2021

(65) Prior Publication Data

US 2022/0284164 A1 Sep. 8, 2022

Related U.S. Application Data

(60) Provisional application No. 63/156,708, filed on Mar. 4, 2021.

(51) Int. Cl.
*G06F 30/392* (2020.01)
*H10W 20/41* (2026.01)

(52) U.S. Cl.
CPC ........ *G06F 30/392* (2020.01); *H10W 20/427* (2026.01)

(58) Field of Classification Search
None
See application file for complete search history.

(56) References Cited

U.S. PATENT DOCUMENTS

| | | | | |
|---|---|---|---|---|
| 5,566,078 A * | 10/1996 | Ding | G06F 30/392 716/135 |
| 7,590,968 B1 * | 9/2009 | Becker | G06F 30/392 716/54 |
| 2010/0293515 A1 * | 11/2010 | Inoue | G06F 30/398 716/118 |
| 2018/0150586 A1 * | 5/2018 | Tien | G06F 30/398 |
| 2018/0165400 A1 * | 6/2018 | Feld | G06F 30/18 |
| 2018/0211947 A1 * | 7/2018 | Chu | G06F 30/394 |
| 2019/0325107 A1 * | 10/2019 | Kim | H01L 23/528 |
| 2020/0104445 A1 * | 4/2020 | Peng | G06F 30/392 |
| 2021/0375762 A1 * | 12/2021 | Chen | H10W 20/427 |
| 2023/0342537 A1 * | 10/2023 | Kong | G06F 30/398 |

* cited by examiner

*Primary Examiner* — Cory W Eskridge
(74) *Attorney, Agent, or Firm* — Merchant & Gould P.C.

(57) ABSTRACT

In some embodiments, portions of a pattern, generated in a layout process, of a layer in an integrated circuit, such as those of a layer of metallic power lines in a power grid (PG), are removed after the layout process through a computer-implemented process analogous to solving the N-coloring problem. Through this post-processing removal process, pattern portions can be removed so as reduce the coverage of the layer in the fabricated integrated circuit to a desired extent without producing certain harmful effects, such as severing a powerline.

18 Claims, 32 Drawing Sheets

SEMICONDUCTOR DEVICE LAYOUT

CROSS-REFERENCE TO RELATED APPLICATIONS

The present application claims the benefit of U.S. Provisional Patent Application No. 63/156,708 titled "LINK REMOVAL FOR PROCESS FAIL ANALYSIS" and filed Mar. 4, 2021, the disclosure of which is hereby incorporated by reference in its entirety.

BACKGROUND

This disclosure relates generally to a method and system for designing and fabricating integrated circuits, and more particularly to designing and fabricating integrated circuits with optimized layouts for failure analysis of the integrated circuits.

In certain integrated circuits, the active regions of devices are formed in the semiconductor substrates at or near the top surface, and electrical connections for power and signals are formed in the layers of conductive lines above (or on the "frontside" of) the devices. Testing of the devices can be carried out by signals transmitted to and from the devices through the substrate, or the backside of the devices. As integrated circuits become more complex, the areas to be tested in an IC device may be obscured by various structures, such as the power grid. Efforts are ongoing in enhancing the ability to test IC devices in complex IC structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 13A-3B illustrate a placement step in a process to open areas in a metal layer according to some embodiments.

DETAILED DESCRIPTION

Figure 1:
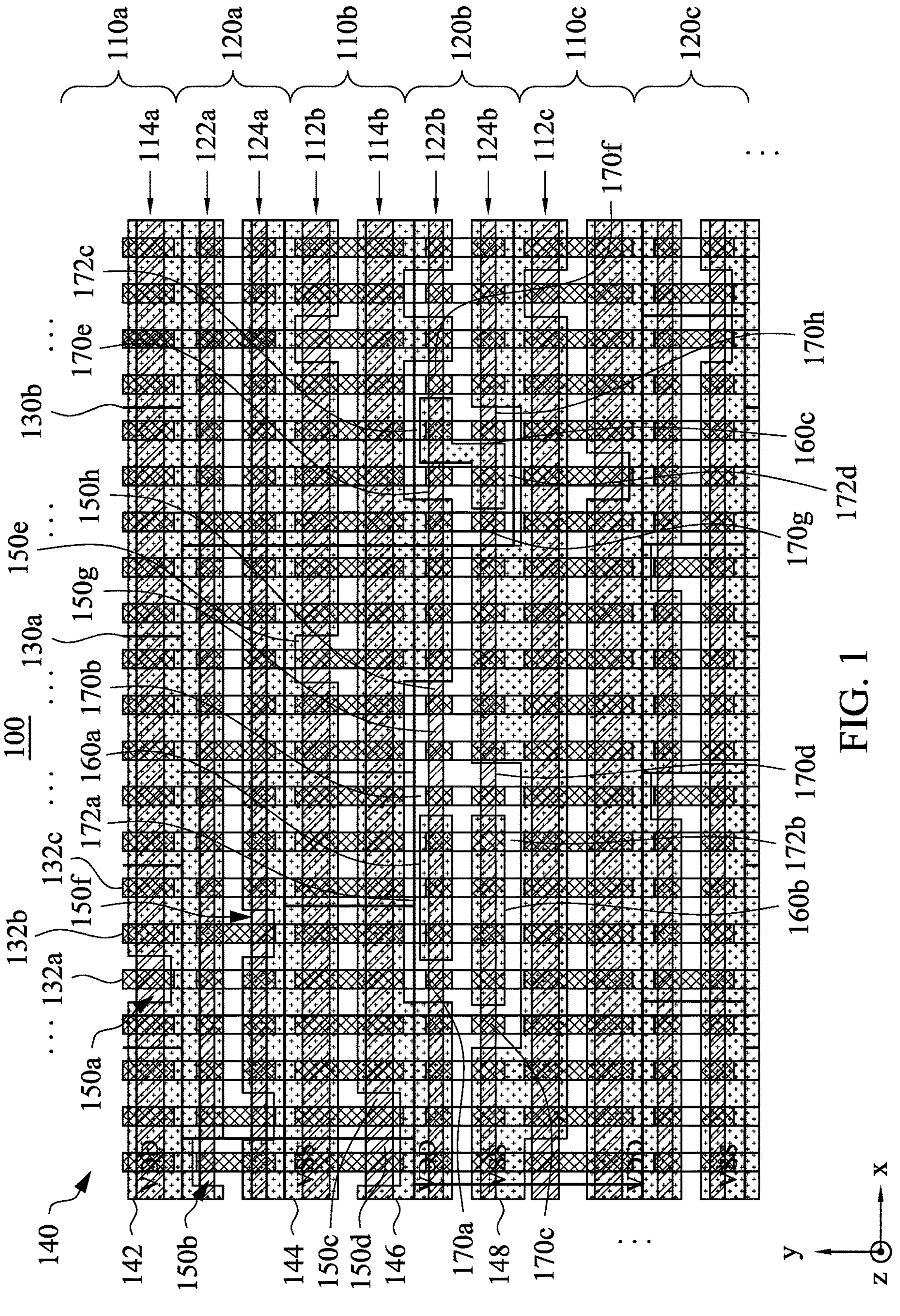
FIG. 1 shows a backside view of a layout of an integrated circuit device according to some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In certain integrated circuits (ICs), the active regions, i.e., semiconductor regions, such as sources, drains, and gates, devices such as transistors are formed in semiconductor substrates at or near the top surface. Transistors may include three-dimensional transistors, such as three-dimensional field-effect-transistors (e.g., fin field-effect transistors (FinFETs), gate-all-around (GAA) transistors (e.g., nanosheet transistors), and/or planar transistors such as metal-oxide-semiconductor field-effect-transistors (MOSFETs). Each of the transistors includes an active region, which may be a fin-shaped region of one or more three-dimensional field-effect-transistors (e.g., FinFETs), a sheet-shaped region of one or more gate-all-around (GAA) transistors (e.g., nanosheet transistors), a wire-shaped region of one or more GAA transistors (e.g., nanowire transistors), or an oxide-definition (OD) region of one or more planar metal-oxide-semiconductor field-effect-transistors (MOSFETs). Portions of the active region may each serve as a source structure or drain structure (or feature) of the respective transistor(s);

and portions of the active region may each serve as a conduction channel of the respective transistor(s). For example, in certain IC devices, fin field-effect transistors (FinFETs) are used. In a FinFET, semiconductor fins are formed (e.g., by etching into a silicon wafer) on top of a substrate (e.g., the unetched layer of silicon below the fins. Structural components, such as sources, drains, gate insulator, and gates, of are built around the fins. The ICs also have one or more layers of conductors, such as metal lines, which can be connected to the active regions through networks of conductors such as intervening layers of conductors and vias. Such layers of conductors serve as electrical connections for power and signals for the various devices (e.g., transistors). The layers of conductors can be layers (sometimes labeled "M0," "M1," "Mn" for the zeroth, first, . . . , nth layers, respectively, with M0 being the closest to the active regions) of conductive lines above (or on the "frontside" of) the devices, i.e., on the same side of the substrate as the active regions. Testing of the devices can be carried out by signals transmitted to, and emitted from, the active regions of the devices through the substrate, or the backside of the devices. As integrated circuits become more complex, however, layers of conductors (sometimes labeled "BM0," "BM1," "BMm" for the zeroth, first, . . . , mth layers, respectively, with BM0 being the closest to the active regions) of conductive lines can be constructed below (or on the "backside" of) the devices, i.e., on the opposite side of the substrate from the active regions. In some cases the substrate can be thinned before the backside layers are added. The connections to the active regions from the backside can be accomplished, for example, by the used of vias through the substrate. Because layers of conductors are on both sides of the active regions, the areas to be tested in an IC device may be obscured by the conductors. Certain examples disclosed herein increase the fraction of devices that are "visible," i.e., from which emitted signals can be detected by external testing instruments.

According to certain embodiments, portions of a pattern, generated in layout process, of a layer of potentially obscuring material, such as those of a layer of metallic power lines in a power grid (PG), are removed after the layout process through a process analogous to solving the N-coloring problem. Through this prestpost-processing removal process, pattern portions can be removed to a desired extent without producing certain harmful effects, such as severing a powerline.

In some embodiments, candidate areas of the pattern for removal are identified, as is every linked pair of the candidate areas. A "linked" pair is a pair of candidate areas the removal of both of which may resulting in the violation of a design constraint, such as resulting in a powerline being too narrow or completely severed. Candidate areas without link to any other candidate area are then removed or marked as removable, resulting in a new pattern of candidate areas. Next, one or more candidate areas with links are removed or marked as removable if certain criterion or criteria are met. An example of such criteria is that the removal any candidate area would not result in a powerline being too narrow or completely severed. Thus, for example, if a linked pair are arranged along a powerline, removing either or both of the pair would not result in the powerline being too narrow or completely severed, and both areas in the pair can thus be removed. In contrast, if the pair is arranged across the powerline, removing both would result in the powerline being too narrow or completely severed, and only one of the areas in the pair can thus be removed. The removal (or marking for removal) process, is repeated from examining any unlinked candidate areas until all removable areas are removed or identified as removable. An optimization process can follow, in which certain removable areas are prevented from removal in order to achieve other goals of circuit design, such as reducing IR drop of the powerlines. For example, if two areas for the same standard cell are removable, removing one would be sufficient to expose the cell for testing, and only one would then be identified as removable.

The process described above in some embodiments are performed by a computerized system such as a system with electronic design automation (EDA) tools. The method in some embodiments are encoded in programs which are stored in a computer-readable medium.

In some embodiments, such as the one illustrated in FIG. 1, an IC device 100 includes multiple rows 110*a*, 120*a*, 110*b*, 120*b*, 110*c*, 120*c* of semiconductor component devices, such as logic gates (e.g., NAND and NOR gates, and inverters) and memory devices (e.g., flipflops and latches), each of which can include multiple transistors and/or other electronic components, such as resistors and capacitors. In some embodiments, such component devices are in the form of standard cells, with component devices in each row having the same cell height (in they-direction) but varying cell widths (in the x-direction). The rows in some embodiments have the same height but in others, such as shown in FIG. 1, have different heights. For example, rows 110*a*, 110*b*, and 110*c*, have one cell height, whereas rows 120*a*, 120*b*, and 120*c* has another, in this case smaller, cell height. In some embodiments, there can also be more complex cells that extend over multiple (e.g., two or three) rows in height.

In some embodiments, such as the one illustrated in FIG. 1, each row of semiconductor component devices includes one or more active semiconductor regions 114*a*, 122*a*, 124*a*, 112*b*, 114*b*, 122*b*, 124*b*, 112*c*, etc., which in some embodiments are active regions of transistors or transistor structures. In some embodiments, such active regions include fin structures, such as single-fin structures, dual-fin or triple-fin structures, small-width nanosheets, and/or large-width nanosheets. In the examples in which fin structures are used, each of the fin structures has one or more semiconductor fins; the fins can have the same width (in this case in the y-direction) or different widths. For example, the fin structures 122*a*, 124*a* in row 120*a* can be single-fin structures; the fin structures 112*b*, 114*b* in row 110*b* can be dual-fin or triple-fin structures. In some embodiments, the semiconductor component devices include gate structures, each including a gate (such as polysilicon gate) 130*a*, 130*b*, etc., extending across and wrapping around a respective fin, with a gate insulator layer (not shown) between the gate and fin. In some embodiments, the semiconductor component devices further include conductive contacts (MDs), such as source/drain contacts 132*a*, 132*b*, 132*c*, etc., extending across and wrapping around a respective fin. The fins, gates and source/drain contacts, together with any insulating material in between, form an active device layer of the IC device 100.

In some embodiments, such as the one illustrated in FIG. 1, the IC device 100 also includes one or more conductive (e.g., metallic) layers 140 above or below the active layer. Where the conductive layer(s) 140 (such as BM0) is on the backside, there can be semiconductor substrate (not shown) intervening the conductive layer 140 and the active device layer. In some embodiments, a conductive layer 140 includes multiple conductive lines 142, 144, 146, 148, etc. These conductive lines can be power distribution lines that are part of the power distribution system, or power grid (PG). For example, in the example embodiment illustrated in FIG. 1, conductive lines 142, 146 are high-voltage rail supplies, VDD, and conductive lines 144, 148 are low-voltage rail supplies, VSS. The conductive line 142 supplies rail voltage VDD to rows 110*a*, 120*a*; the conductive line 142 supplies rail voltage VDD to rows 110*a*, 120*a*; The conductive line 144 supplies rail voltage VSS to rows 120*a*, 110*b*; the conductive line 146 supplies rail voltage VDD to rows 110*b*, 120*b*; the conductive line 148 supplies rail voltage VSS to rows 120*b*, 110*c*. The conductive lines 142, 144, 146, 148, etc., in this example each nominally cover one fin structure in each row that shares the conductive line. For example, VDD line 142 nominally covers the fin structures 114*a* in row 110*a* and 122*a* in row 120*a*; VSS line 144 nominally covers the fin structures 124*a* in row 120*a* and 112*b* in row 110*b*; VDD line 146 nominally covers the fin structures 114*b* in row 110*b* and 122*b* in row 120*b*; and VSS line 148 nominally covers the fin structures 124*b* in row 120*b* and 112*c* in row 110*c*.

In some embodiments, in addition to power supply lines, the conductive layer 140 also includes conductive signal lines, such as those 160*a*, 160*b*, 160*c* shown in FIG. 1. Such conductive layers can be referred to as "hybrid layers." The signal lines, 160*a*, 160*b*, 160*c* in this example are isolated on all sides from the power lines VDD 146 and VSS line 148. For example, the signal line 160*a* is isolated from the VDD line 146 on the left side (in x-direction) by a region 170*a* that has a width in the x-direction such that at least one source/drain contact region neighboring the signal line 160*a* is not covered by the VDD line 146. Similarly, the signal line 160*b* is isolated from the VSS line 148 on the left side (in x-direction) by a region 170*c* that has a width in the x-direction such that at least one source/drain contact region neighboring the signal line 160*b* is not covered by the VSS line 148. The signal lines 160*a* and 160*b* are likewise isolated from the VDD line 146 and VSS line 148, respectively, on the right by regions 170*b*, 170*d*, respectively. The signal lines 160*a* and 160*b* are also isolated from the VDD line 146 on the topside and VSS line 148 on the bottom side, respectively, by isolation regions 172*a*, 172*b*. In this example, the width of the isolation regions 172*a*, 172*b* is nominally the difference between half the width of VDD line 146 or VSS line 148 and the width each of the signal lines 160*a*, 160*b*, respectively. The signal line 160*c* in this example is similarly isolated from the VDD line 146 and VSS line 148 by regions 170*e-h*, 172*c* and 172*d*.

In some embodiments, the conductive lines conductive layer 140 includes openings in addition to those for accommodating any signal lines. For example, the VDD line 142 has openings 150*a*, 150*b*, exposing respective source/drain contact regions that would otherwise be obscured by the VDD line 142. Similarly, the VSS line 144 has openings 150*e*, 150*f*, among others; the VDD line 146 has openings 150*c*, 150*d*, 150*g*, 150*h*, where openings 150*g*, 150*h* are continuous with opening 170*b* but are not necessary for isolating any signal line from any power supply line.

In the example embodiment illustrated in FIG. 1, the opening 150*a-h* can be on either side of the conductive lines 142, 144, 146, 148 in the y-direction. Thus, for example, conductive lines 142, 144, 146 each have at least one opening in each row that shares the conductive line.

With each opening, at least a part of the semiconductor device (e.g., a transistor) exposed can be subject to test, such as physical failure analysis (PFA), by, for example, radiation emitted to and/or from the part of the semiconductor device exposed. Such PFA techniques in some embodiments include thermal emission, photo emission (e.g., emission microscopy, of EMMI), dynamic laser stimulation (DLS) and/or laser voltage probing (LVx).

Figure 2A:
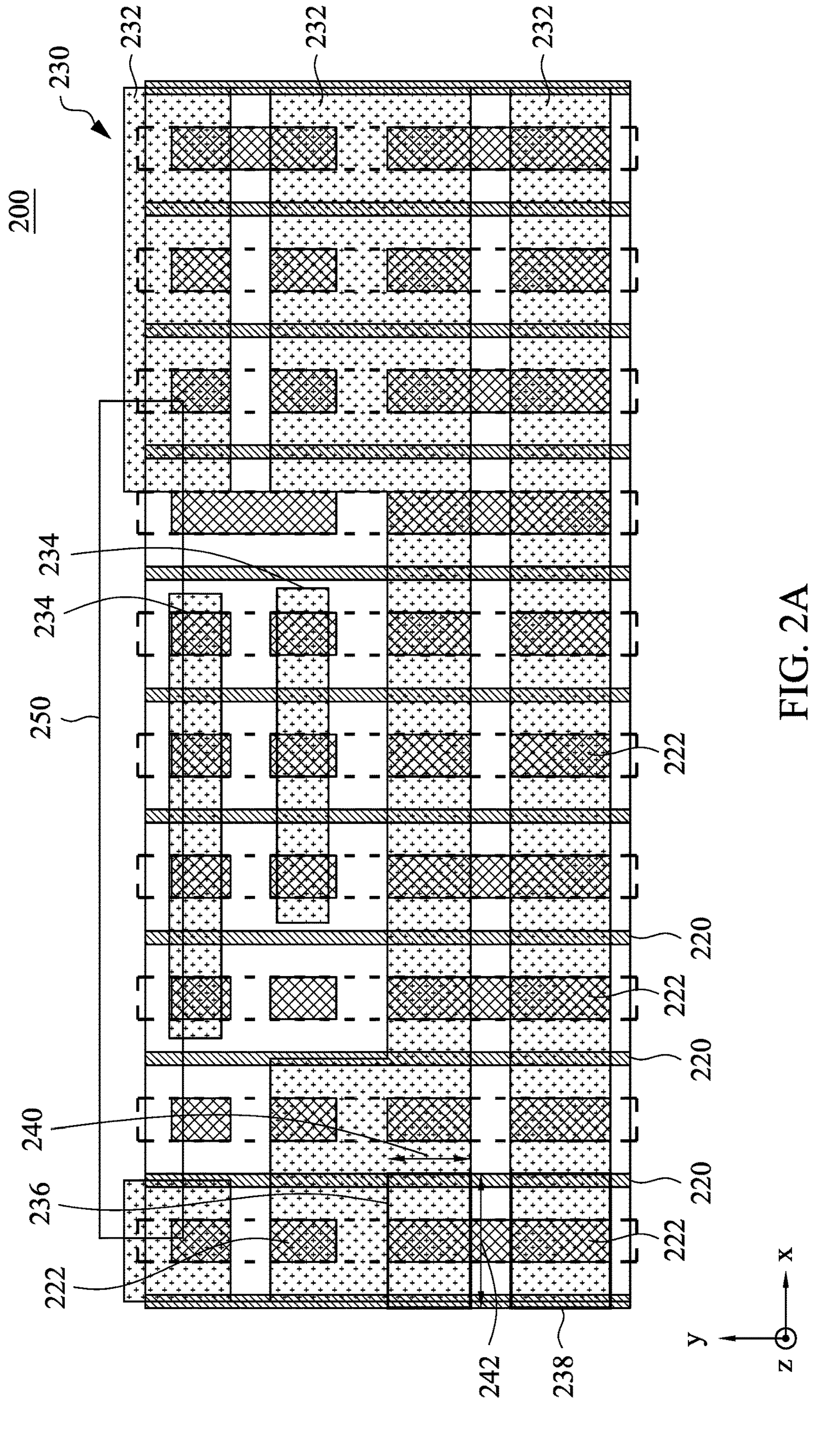
FIGS. 2A-2C show selection of candidate areas for openings in a metal layer in an integrated circuit device according to some embodiments.
Figure 2C:
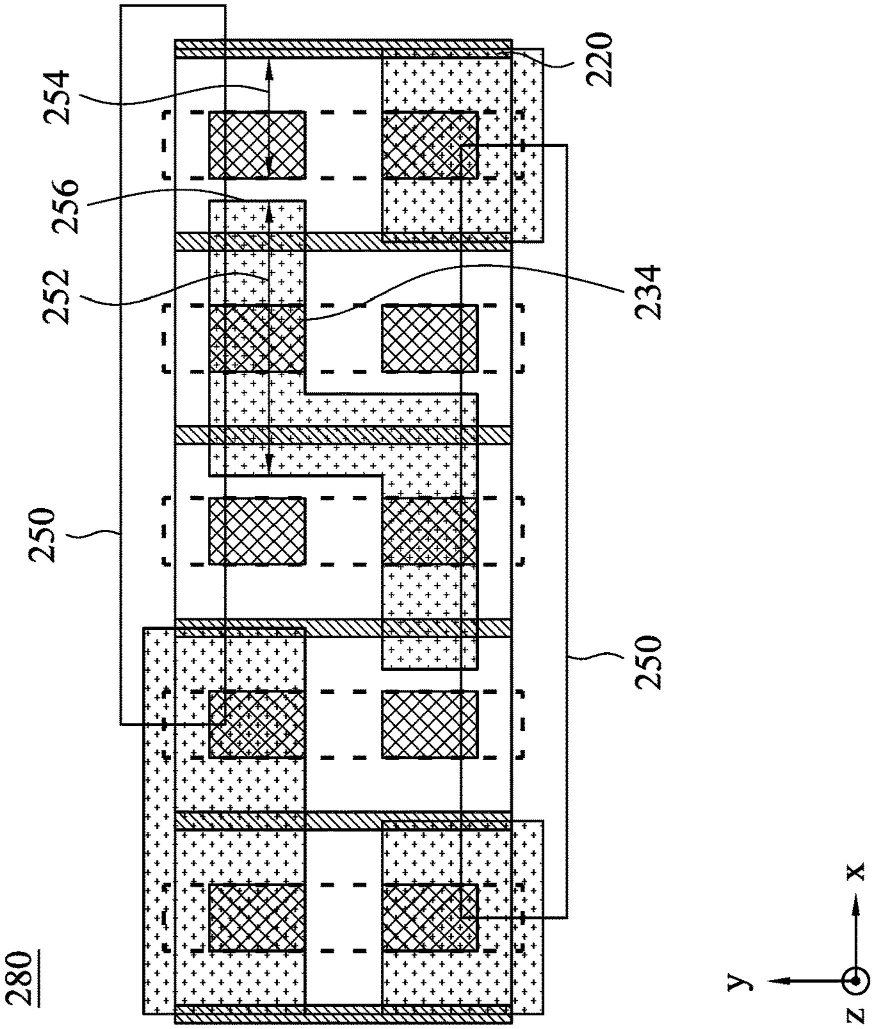
Figure 2B:
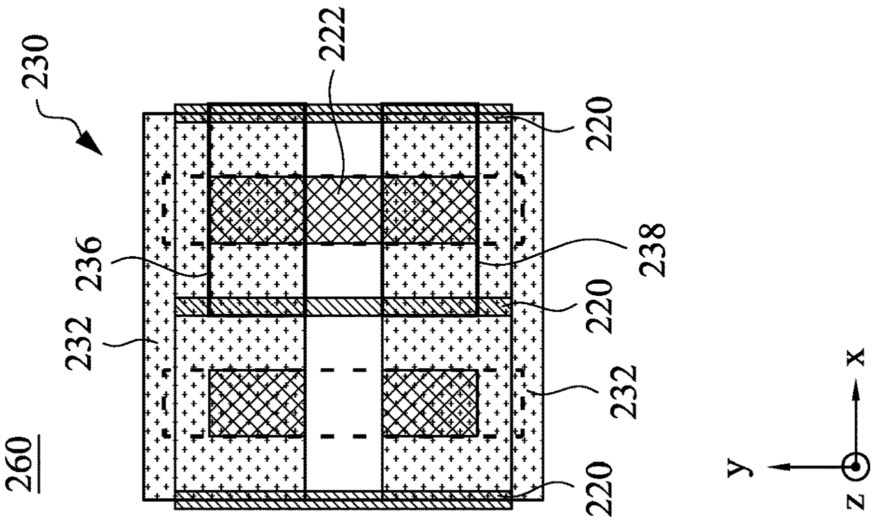

In some embodiments, designing an IC device with optimized, or improved, conductive layer pattern begins with identifying in a conductive layer in a starting layout the regions that can potentially be removed, or opened (potential open locations). The starting layout can be a layout that is the result a placement and routing step in integrated circuit design. The placement and routing step is performed in some embodiments by an electronic design automation (EDA) tool. In some embodiments, as illustrated in FIGS. 2A-2C, identifying potential open locations in a conductively layer 230 of an IC device 200, 260 involve identifying areas in which the removal of a portion of the conductive layer 230 would result in exposing (i.e., making transparent to the radiation for the PFA) a portion of the semiconductor region, such as the fin structure (OD) (not shown in FIGS. 2A-2C; 114*a*, 122*a*, 124*a*, 112*b*, 114*b*, 122*b*, 124*b*, 112*c* in FIG. 1) and conductive contact (MD) (222 in FIGS. 2A and 2B; 132*a*, 132*b*, 132*c* in FIG. 1) that would otherwise be obscured by the conductive layer 230. In some embodiments, the size of a potential open window 236, 238 in the conductive layer is dependent on the width of the OD and spacing between the neighboring gates 220 (e.g., center-to-center distance, sometimes referred to as "poly pitch"). For example, as illustrated in FIGS. 2A and 2B, in some embodiments, a potential open window has a height (in the y-direction) of the width of the OD plus a minimum width, sometimes referred to as "overlay," that by which a conductive line 232 is designed to extend beyond the OD width. For the BM0 layers, the overlay is denoted as "BM0_OVL" in this disclosure. In some embodiments, the overlay is 3-10 nm. A potential open window in some embodiments has a width of approximately the poly pitch (e.g., 0.9 to 1.1 times the poly pitch).

In some embodiments, the identification of potential open locations involves considerations of only factors relating to the location in the conductive layer itself, and not the location relative to any other potential open locations. For example, the initial identification can be identifying all locations where radiation signals from OD regions are desired but where the OD regions are obscured by the conductive layer (e.g., BM0). Not all OD regions need to be tested. For example, certain portions of the conductive lines may cover "filler" portions, in which no functional devices exist. There is no need to open the conductive layer over the filler portions.

Next, certain restrictions on where windows may be opened can be considered. For example, in the embodiments, such as shown in FIGS. 2A and 2C, any potential open window should not encroach into any forbidden zone 250 adjacent a signal line 234. In some embodiments, a forbidden zone 250 has a height (in the y-direction) of 2 to 4 times BM0_OVL from approximately the edge of the OD region. A forbidden zone 250 in some embodiments has a width (in the x-direction) of the length 252 of the signal line 234, plus the distance 254 from the end 256 of the signal line 234 to the center next gate 220 (BM0 space) at each end of the signal line 234, plus one half poly pitch at each end of the signal line 234.

In some embodiments, the distances between each potential open window identified to it closest neighboring potential open windows are examined, and a determination is made as to whether any of the distances is smaller than a threshold distance. If any such distance is equal to or smaller than the threshold distance, the two potential open windows are considered "linked." Whether any potential open window that is linked to at least one other potentially open window can be opened depends at least in part on the special relationship between the linked potential open windows and the number of other potential open windows each potential open window is linked to, as described in more detail below. In some embodiments, the processes of identifying linked potential open windows and counting links are conceptually illustrated in FIGS. 3A and 3B. First, the distances between each potential open window and its neighboring potential windows are compared to a threshold distance. In FIG. 3A, potential open windows of arbitrary geometric shape are represented as conductive patches 332 $P_1$, $P_2$, $P_3$, and $P_4$. The distances 342 between $P_1$ and $P_2$, 344 between $P_2$ and $P_3$, 346 between $P_2$ and $P_4$, and 348 between $P_3$ and $P_4$ are compared to a threshold distance. The threshold distance can be any distance determined to be suitable for the IC device. In some embodiments the threshold distance is about 1.5 times the poly pitch. In the example shown in FIG. 3A, the distances 344 between $P_2$ and $P_3$, and 346 between $P_2$ and $P_4$ are deemed to be greater than the threshold distance; and the distances 342 between $P_1$ and $P_2$, and 348 between $P_3$ and $P_4$ are deemed to be equal to or smaller than the threshold distance.

Conceptually, the spatial relationship between the potential open windows can be described as linkage, or lack thereof, between nodes. As shown in the example in FIG. 3B, potential open windows 332 $P_1$, $P_2$, $P_3$, and $P_4$ in FIG. 3A are represented by nodes $N_1$, $N_2$, $N_3$, and $N_4$, respectively. An inter-potential-open-window distance equal to or shorter than the threshold distance is symbolized by a link between the nodes. Thus, for example, the fact that the distances 342 between $P_1$ and $P_2$, and 348 between $P_3$ and $P_4$ are equal to or smaller than the threshold distance is represented by the link 342*a* between nodes $N_1$ and $N_2$, and link 346*a* between $N_2$ and $N_4$. Each node thus has associated with it a link number, i.e., number of links the node has with other nodes. In the example shown in FIG. 3B, the link number for node $N_3$ is 0; the link number for nodes $N_1$ and $N_4$ is 1; and the link number for node $N_2$ is 2. The determination of whether a potential open window can indeed be opened can be made based on the link number and directional relationship it has with the linked node(s).

Figure 3B:
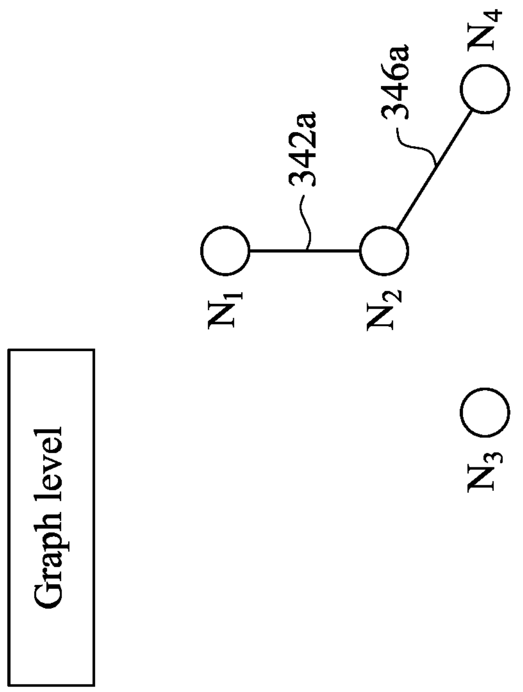
FIG. 3A-3D illustrate identifying links between candidate areas according to some embodiments.
Figure 3A:
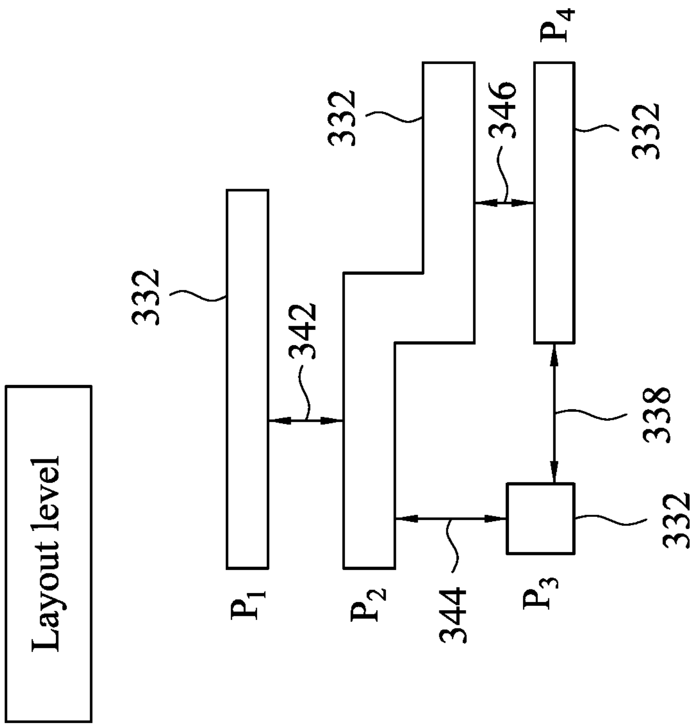

For example, because node $N_3$ in FIG. 3B has a link number 0, the potential open window associated with node $N_3$, i.e., $P_3$, is sufficiently far from any other potential open windows and, consequently, can be opened. Node $N_1$, $N_2$, and $N_4$, in contrast, have link number 1 or greater, and whether $P_1$, $P_2$, and $P_4$ can be opened depends on the orientational relationship between the nodes, as described in more detail below.

In some embodiments, the process of determining whether a potential open window can be opened is an iterative process. That is, after certain determining to designating certain potential open windows for opening or not opening, the remaining potential open windows are reexamined to determine if any are openable. For example, in FIGS. 3A and 3B, if it is determined that $P_2$ is not to be opened, then node $N_2$ is removed as a node corresponding to a potential open window, the links 342*a*, 346*a* are removed. As a consequence, the link number for nodes $N_1$ and $N_2$ becomes 0, and $P_1$ and $P_2$ can be designated for opening.

Figure 3C:
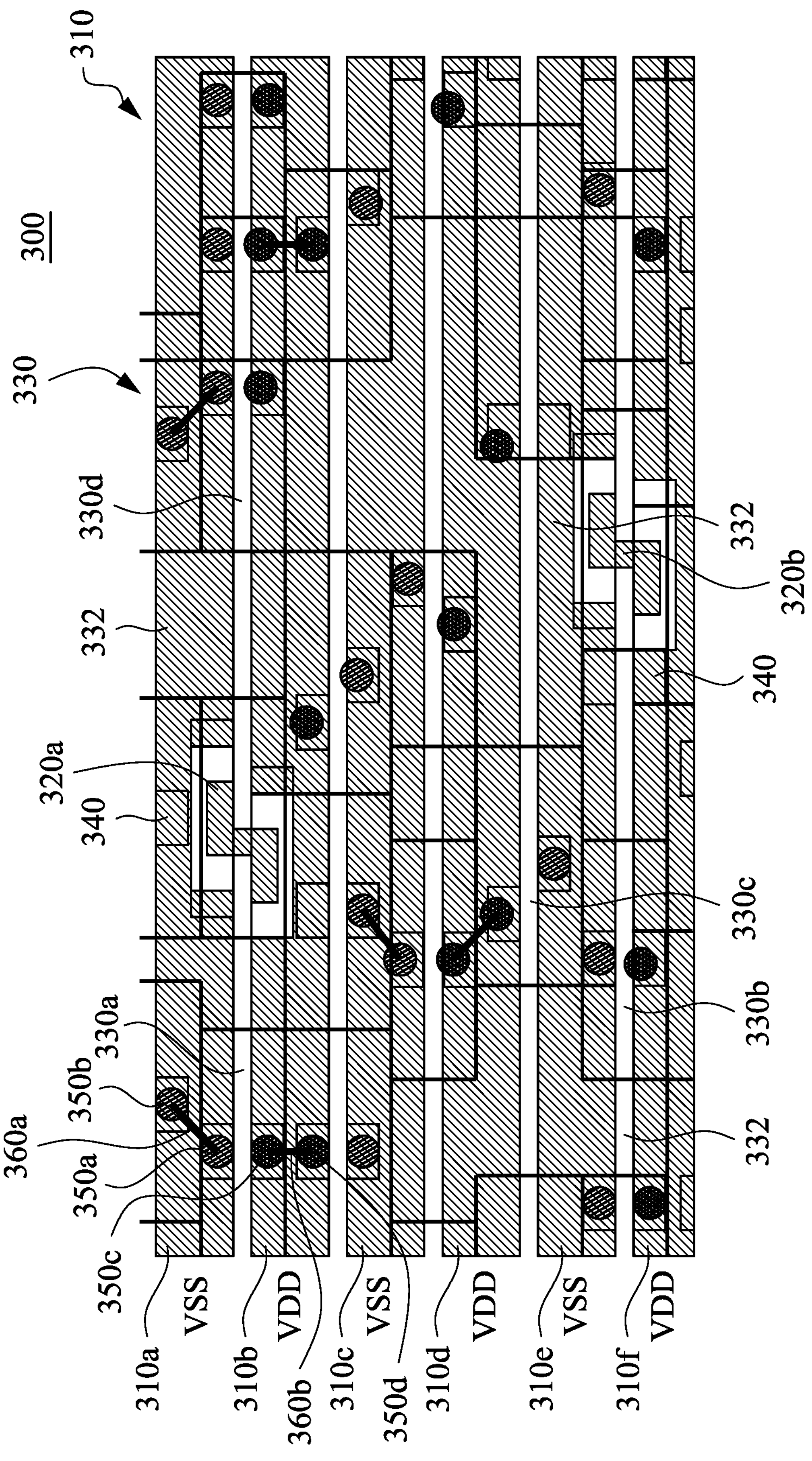
Figure 3D:
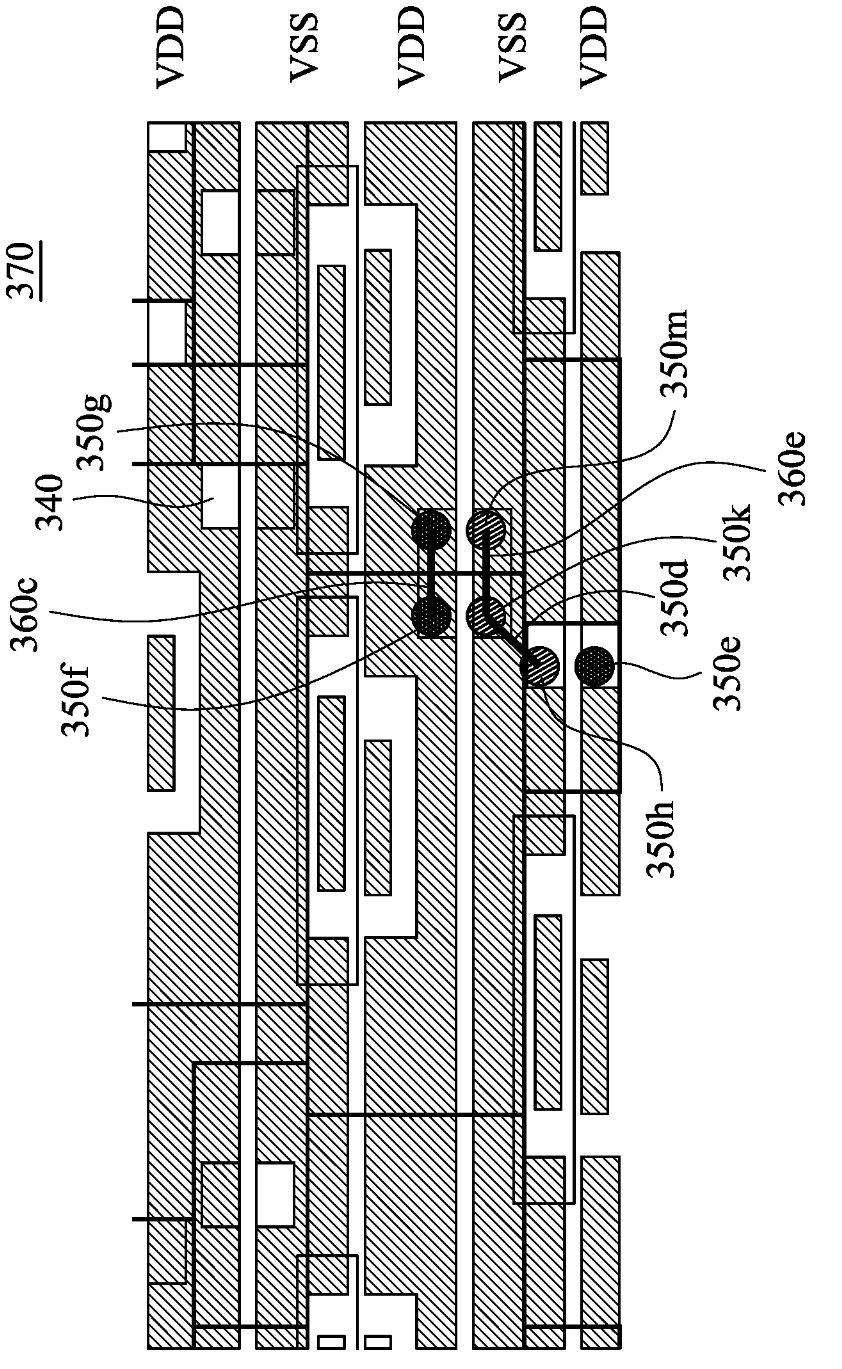
Figure 7:
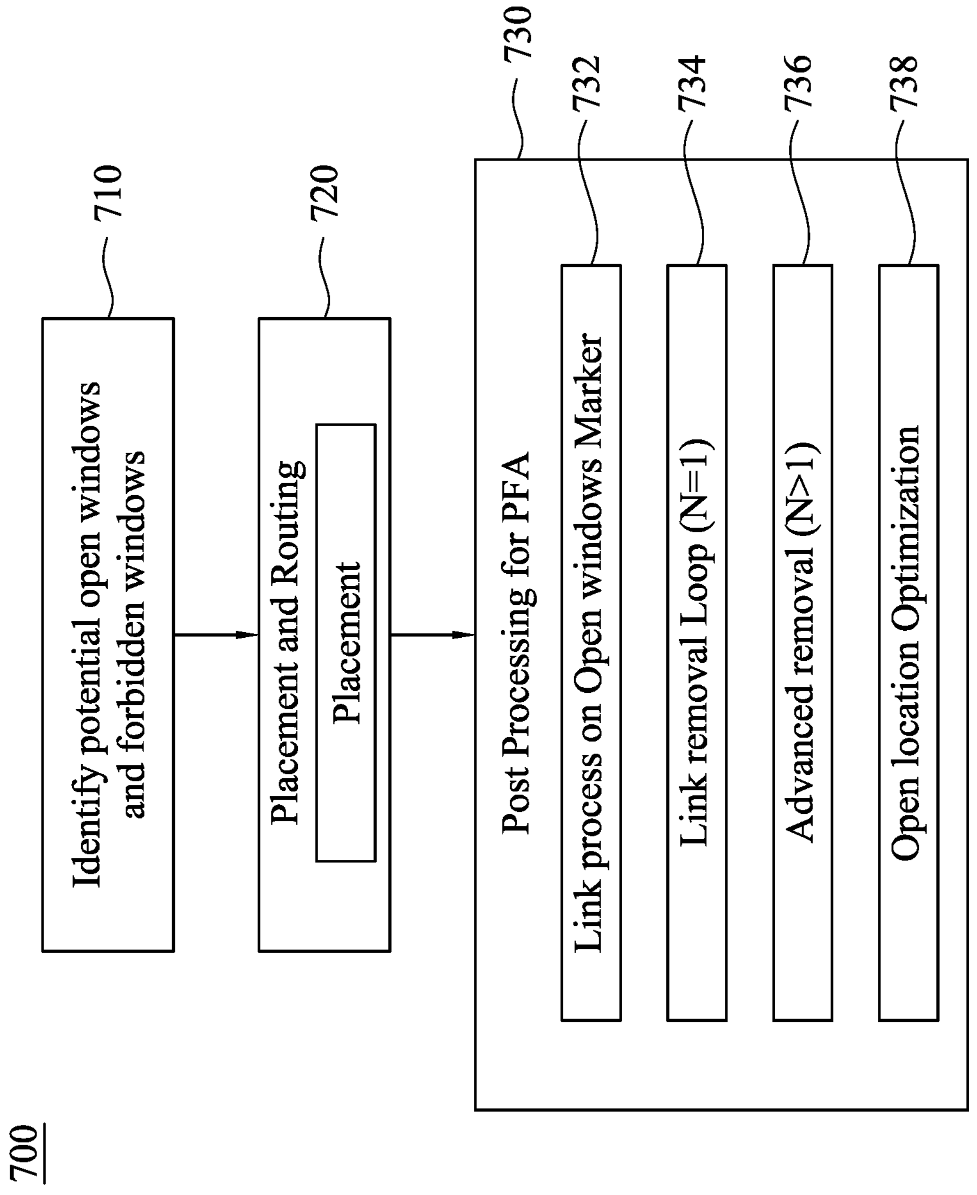
FIG. 7 outlines the process for determining areas to open in a metal layers in an integrated circuit device according to some embodiments.

As a more specific example, with reference to FIGS. 3C, 3D and 7, in a process 700 (FIG. 7), potential open windows and forbidden windows are first identified 710. As shown in the example in FIG. 3C, a conductive layer (e.g., BM0) 310 in a portion 300 of an IC device includes power lines (VDD, VSS) 310*a-f* and signal lines 320*a*, 320*b*. The conductive layer 310 are disposed over cells (e.g., standard cells) 330 (e.g., 330*a*, 330*b*, 330*c*, 330*d*, delineated in FIGS. 3C and 3D by rectangular boxes each straddling a pair of power lines VDD and VSS) as well as filler spaces 332. Potential open windows (marked as small rectangular boxes with round dots, such as those labeled 350*a-d*) and forbidden windows (marked as small open rectangular boxes) are identified (step 710 in FIG. 7). In some embodiments, each cell has a pair of potential open windows, one on the VDD side and the other on the VSS side of the output device. For example, as shown in FIG. 2B, the inverter 260 has a pair of potential open windows 236, 238 at the output 222.

Next, after an optional placement and routing step 720 (FIG. 7) (described in more detail below), a set of post-processing steps 730 are taken to determine which optional open windows end up in the final layout of the conductive layer. As a first step, links (line segments connecting the round dots in FIGS. 3C and 3D) are identified 732 (FIG. 7) between potential open windows that are spaced apart by the threshold distance (e.g., 1.5 poly pitch) or closer. As a result, certain potential open windows, such as 350*e* in FIG. 3D are unlinked, i.e., have a link number 0.

In some embodiments, as in this example, only potential open windows in the same conductive line (VSS or VDD) are linked. For example, potential open windows 350*a*, 350*b* in VSS line 310*a* are identified as linked by the link 360*a*, and potential open windows 350*c*, 350*d* in the VDD line 310*b* are identified as linked by the link 360*b*. However, potential open windows in different power lines are not linked even if they are closer to each other than the threshold distance. For example, potential open windows 350*a*, 350*c* in FIG. 3C are closer than the threshold distance but are not linked because they are in different power lines VSS 310*a* and VDD 310*b*, respectively.

At the end of link identification 732, potential open windows of various link numbers (0, 1, 2, . . . ) and forbidden windows are identified. For example, a portion 370 of a conductive layer in FIG. 3D includes potential open window 350*e* of link number 0, potential open windows 350*f*, 350*g*, 350*h*, 350*m* of link number 1 (links 360*c*, 360*d*, 360*e*), and potential open window 350*k* of link number 2 (links 360*d*, 360*e*). The portion 370 of the conductive layer in FIG. 3D also includes a number forbidden windows 340.

Figure 4A:
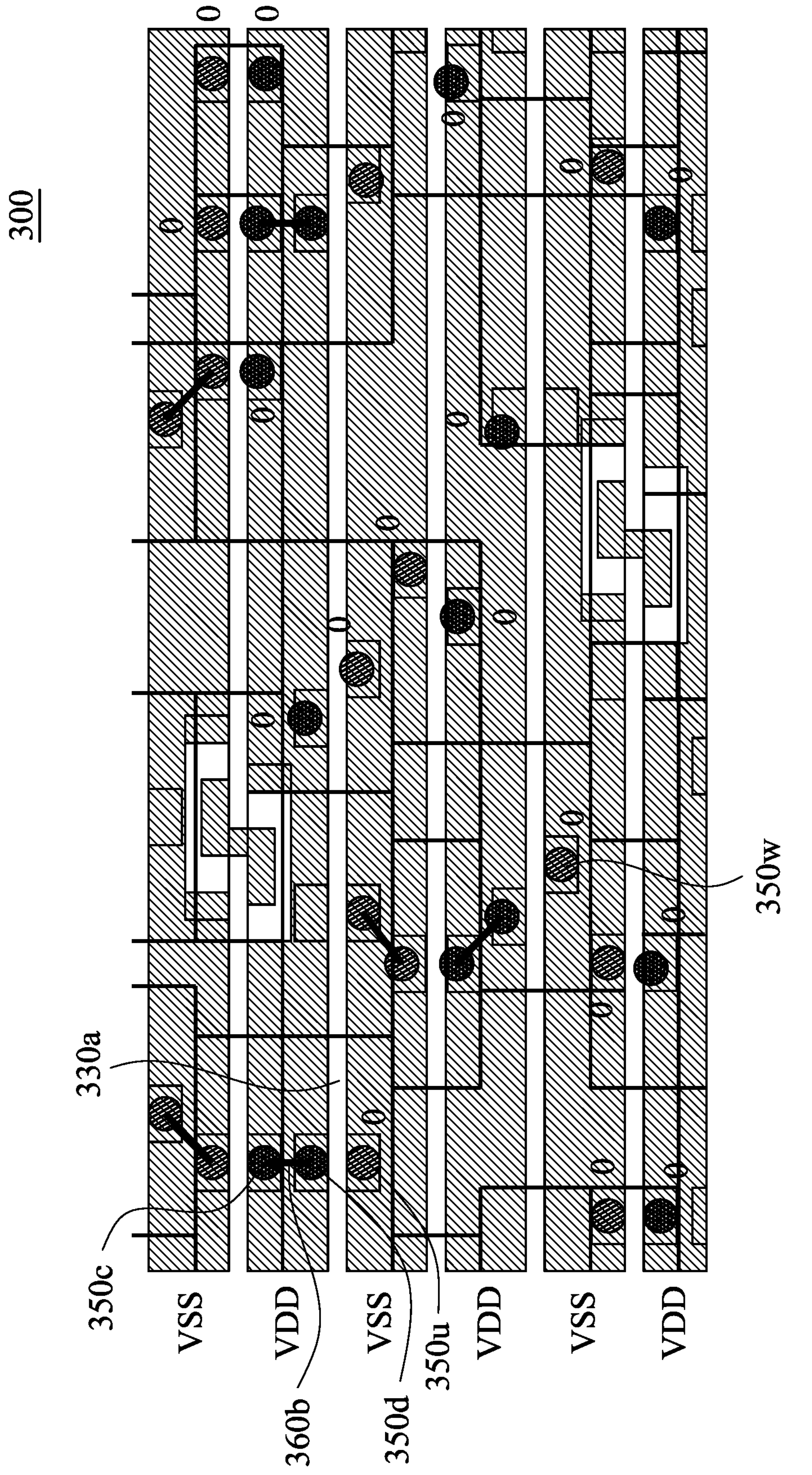
FIGS. 4A-4B illustrate determining which candidate areas can or cannot be opened according to some embodiments.
Figure 4B:
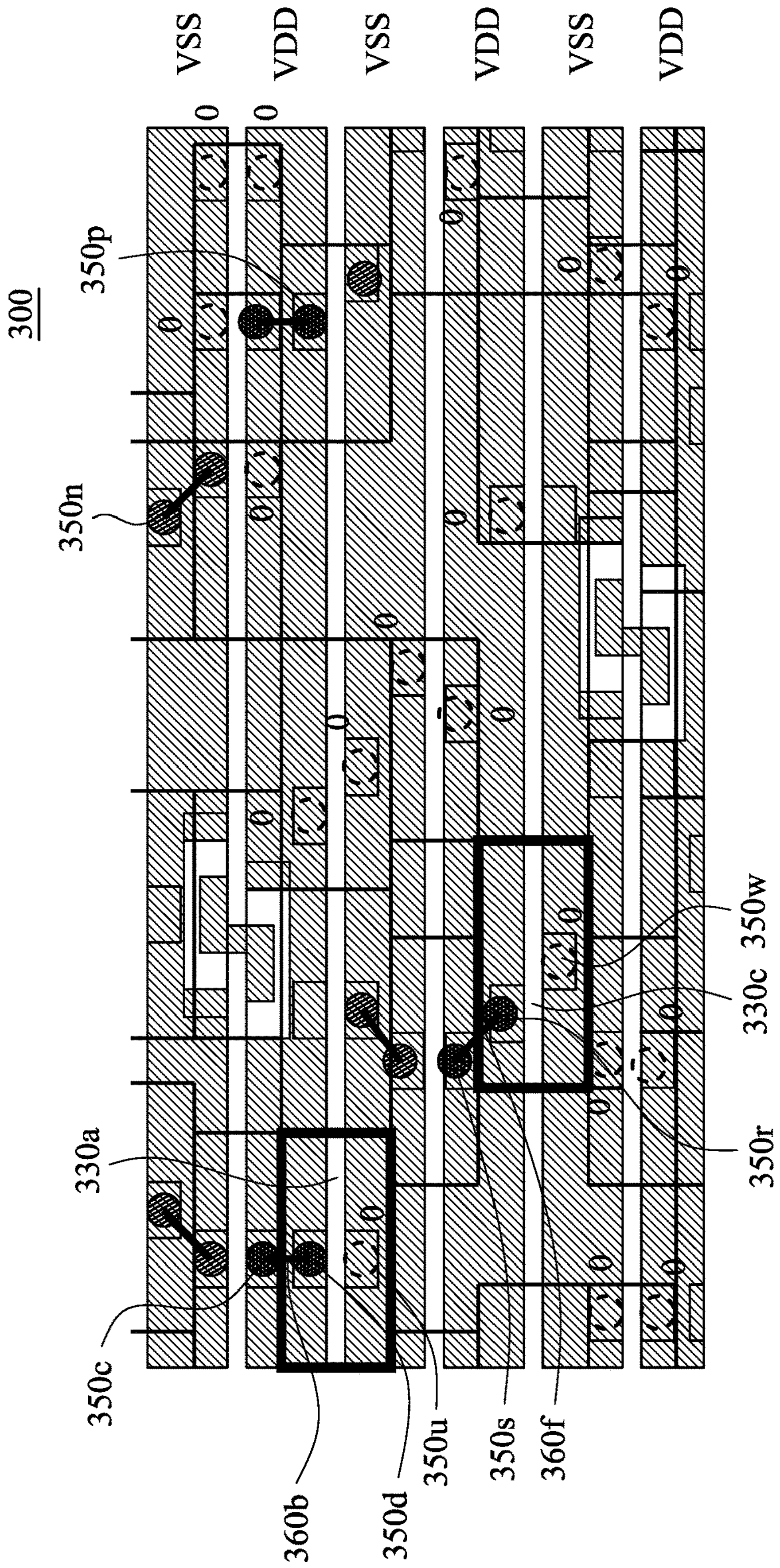
Figure 8A:
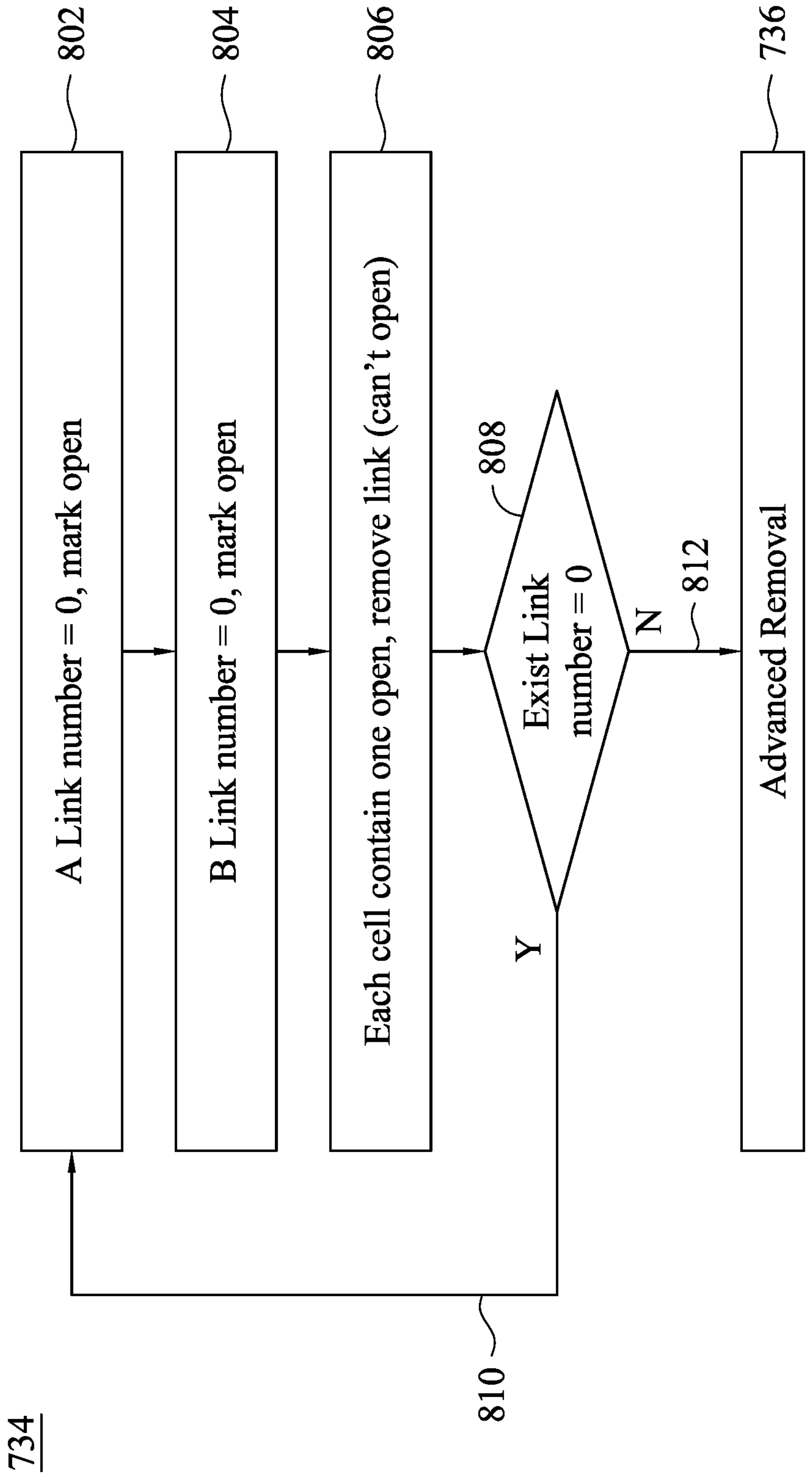
FIG. 8A outlines the process illustrated in FIGS. 4A-4B according to some embodiments.

In some embodiments, as shown in FIGS. 4A and 4B, in the next step 734 (FIGS. 7 and 8A), potential open windows of link number less than N=1, i.e., link number 0 (labeled "0" in FIGS. 4A and 4B) are designated as "open," (dashed circles in FIG. 4B) i.e., can be opened. The designation can be carried out separately for VDD lines ("A Link" in FIG. 8A) 802 and for VSS lines ("B link" in FIG. 8A) 804. In some embodiments, where a cell has a pair of potential open windows, once one of the potential open windows is designated as open, the other potential open window in the cell is designated as not to opened, as only one opening per cell is needed (e.g., in the case of inverter output 222 in FIG. 2B), and its link to any other potential open window is removed 806 (FIG. 8). As a result of the link removal, the link numbers of at least some of the remaining potential open windows will be decremented by at least 1 and may become 0. For example, in FIG. 4B, after designating potential open windows 350*u*, 350*w* as open, potential open window 350*d*, which shares a cell 330*a* with potential open window 350*u*, and potential open window 350*r*, which shares a cell 330*c* with potential open window 350*w*, are removed as potential open windows. The links 360*b*, 360*f* to the now not-to-be opened windows 350*d*, 350*r*, respectively, are removed. As a result, potential open windows 350*c*, 350*s*, which had a link number 1, now has link number 0. Similarly, the link number for the potential open windows 350*n*, 350*p* becomes 0 following the procedure described above.

While any potential open window with a link number 0 exists 808 (FIG. 8A), the procedure described above is repeated 810 until no potential open window with a link number 0 remains. The process then proceeds 812 to the next step 736 (FIG. 7).

Figure 5A:
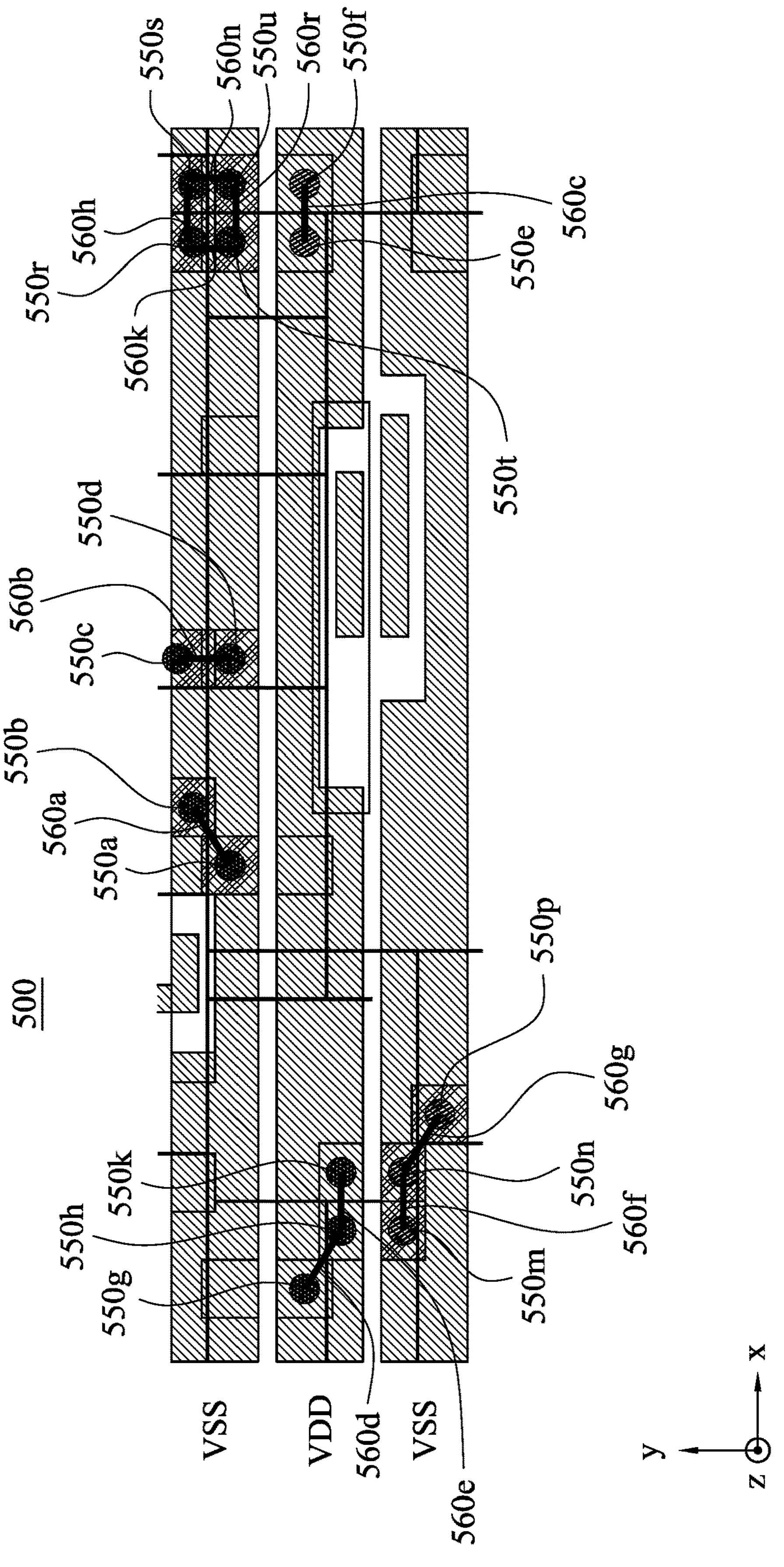
FIGS. 5A-5C illustrate determining which candidate areas with links can or cannot be opened according to some embodiments.

In step 736, with reference to FIG. 5A, potential open windows with link numbers of 1 or greater are examined. In the example shown in FIG. 5A, potential open windows 550*a-g*, 550*k*, 550*m*, 550*p* have a link number of 1, with respective links 560*a-g* as indicated; potential open windows 550*h*, 550*n* have a link number of 2, with respective links 560*d-g* as indicated; potential open windows 550*r-u* have a link number of 4, with respective links 560*h*, 560*k*, 560*m*, 560*n*, 560*p*, 560*r* as indicated.

Figure 5B:
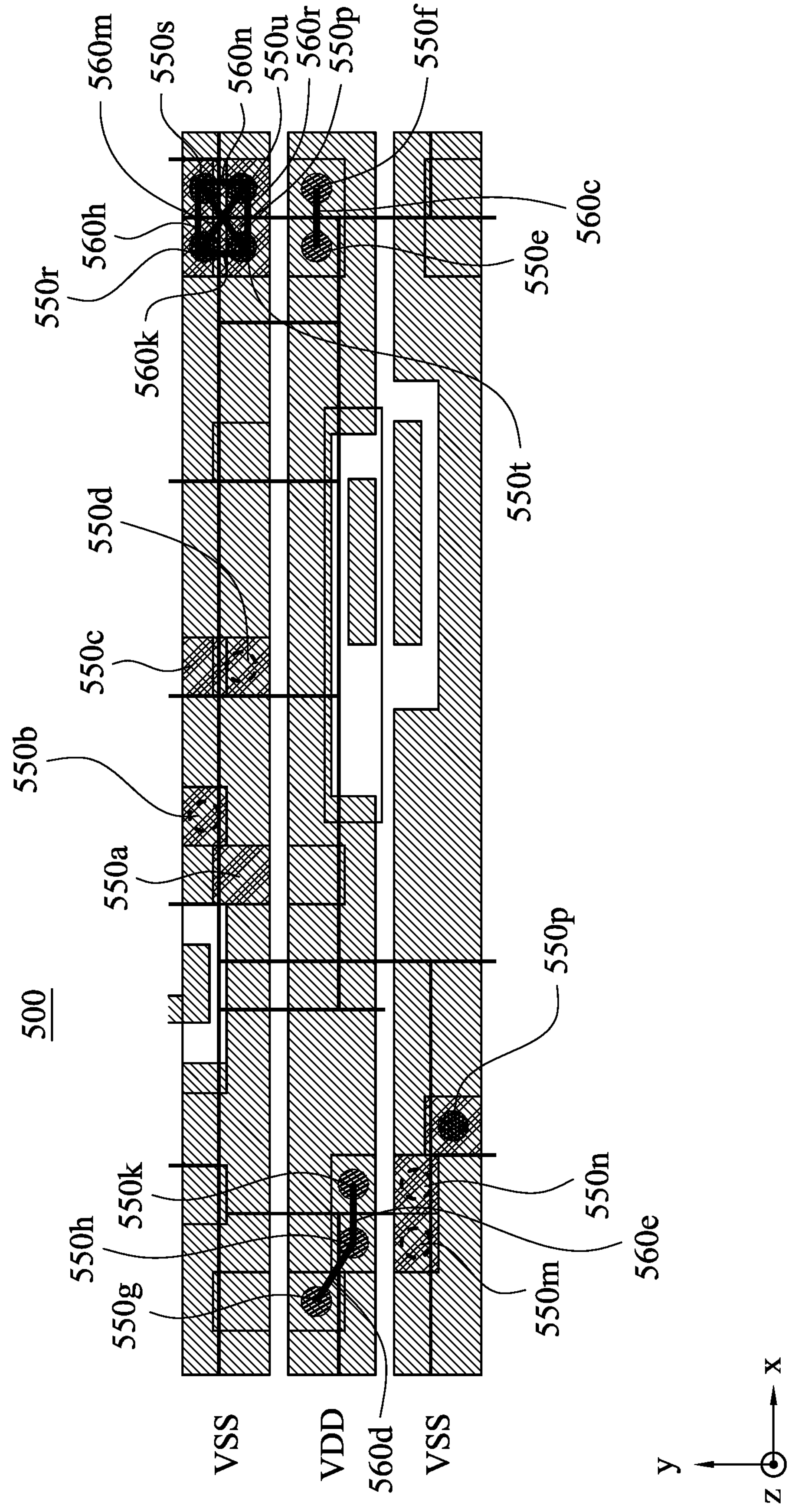
Figure 5C:
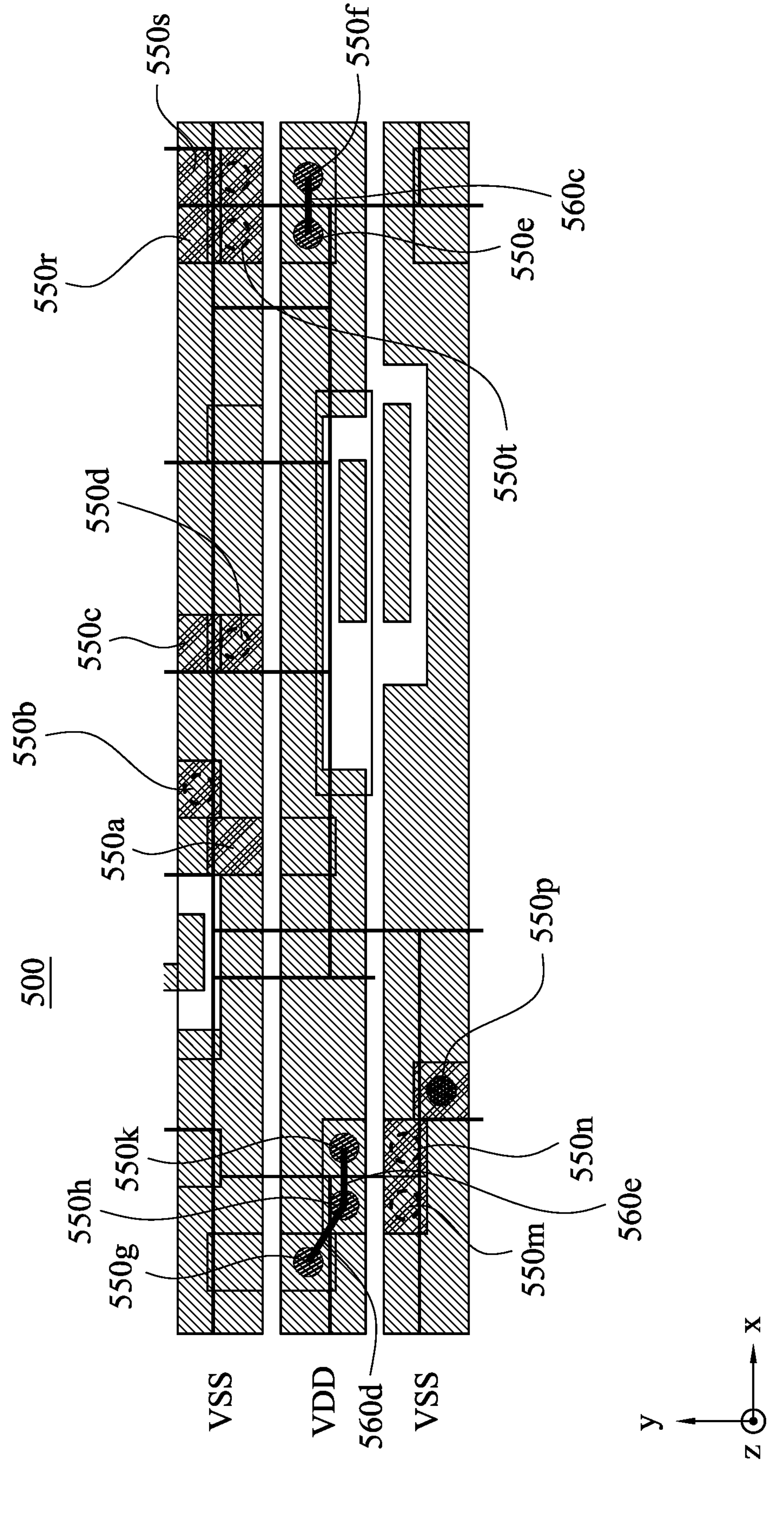
Figure 8B:
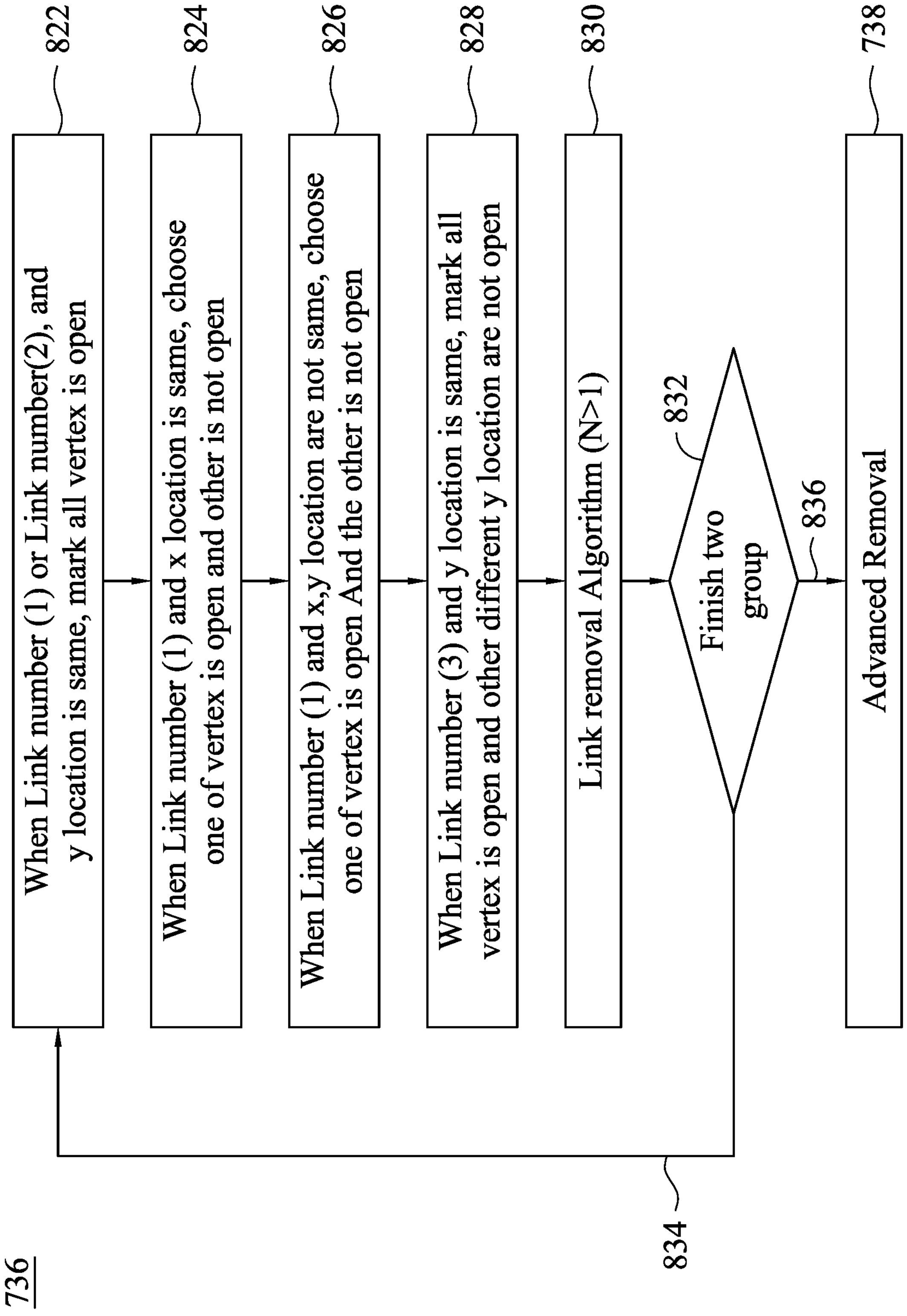
FIG. 8B outlines the process illustrated in FIGS. 5A-5C according to some embodiments.
Figure 8C:
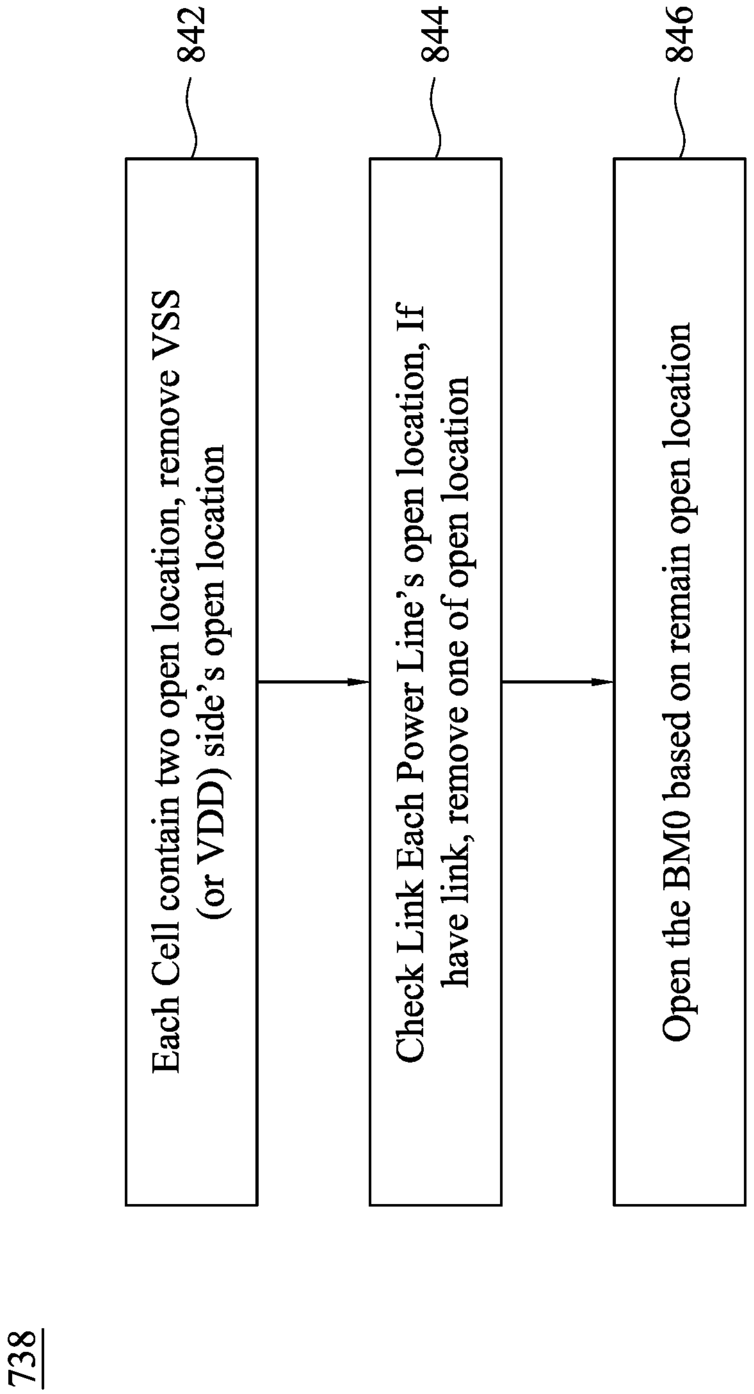
FIG. 8C outlines the process illustrated in FIGS. 6A-6B according to some embodiments.

In some embodiments, as outlined in FIG. 8B, for linked potential open windows where the link numbers are 1 or 2, and the potential open windows are arranged in a direction parallel to the length of the power lines VDD or VSS, i.e., have the same y-position, as is the case for the potential open windows 550*m*, 550*n*, all of the potential open windows are designated as open 822 (FIG. 8B), as shown in FIG. 5B. Next 824, for linked potential open windows where the link number is 1, and the potential open windows are arranged in a direction perpendicular to the length of the power lines VDD or VSS, i.e., have the same x-position, as is the case for the potential open windows 550*c*, 550*d*, one of the potential open windows (in this example 550*d*) is designated as open whereas the other one (in this example 550*c*) is removed as a potentially open window, as shown in FIG. 5B. Next 826, for linked potential open windows where the link number is 1, and the potential open windows are arranged in a direction either parallel nor perpendicular to the length of the power lines VDD or VSS, i.e., have the different x- and y-positions, as is the case for the potential open windows 550*a*, 550*b*, one of the potential open windows (in this example 550*b*) is designated as open whereas the other one (in this example 550*a*) is removed as a potentially open window, as shown in FIG. 5B. Next 828, for linked potential open windows where the link number is 3, and the potential open windows are arranged in a direction parallel to the length of the power lines VDD or VSS, i.e., have the same y-position, as is the case for the potential open windows 550*t*, 550*u*, all of the potential open windows are designated as open whereas the other ones (in this example 550*r*, 550*s*), which are in different y-positions are removed as potentially open windows, as shown in FIG. 5C.

Next 830, after the potential open windows are all either designated as open or removed as potential open windows, all links to these previously potential open windows are removed. For example, as shown in FIGS. 5A-5C, the link 560*g* between the potential open windows 550*n*, 550*p* is removed after the potential open window 550*n* is designated as open. While any potential open window with a link number 1 or greater exists 832 (FIG. 8B), the procedure described above is repeated 834 until no potential open window with a link number 1 or greater remains. The process then proceeds 836 to the next step 738 (FIG. 7).

Figure 6A:
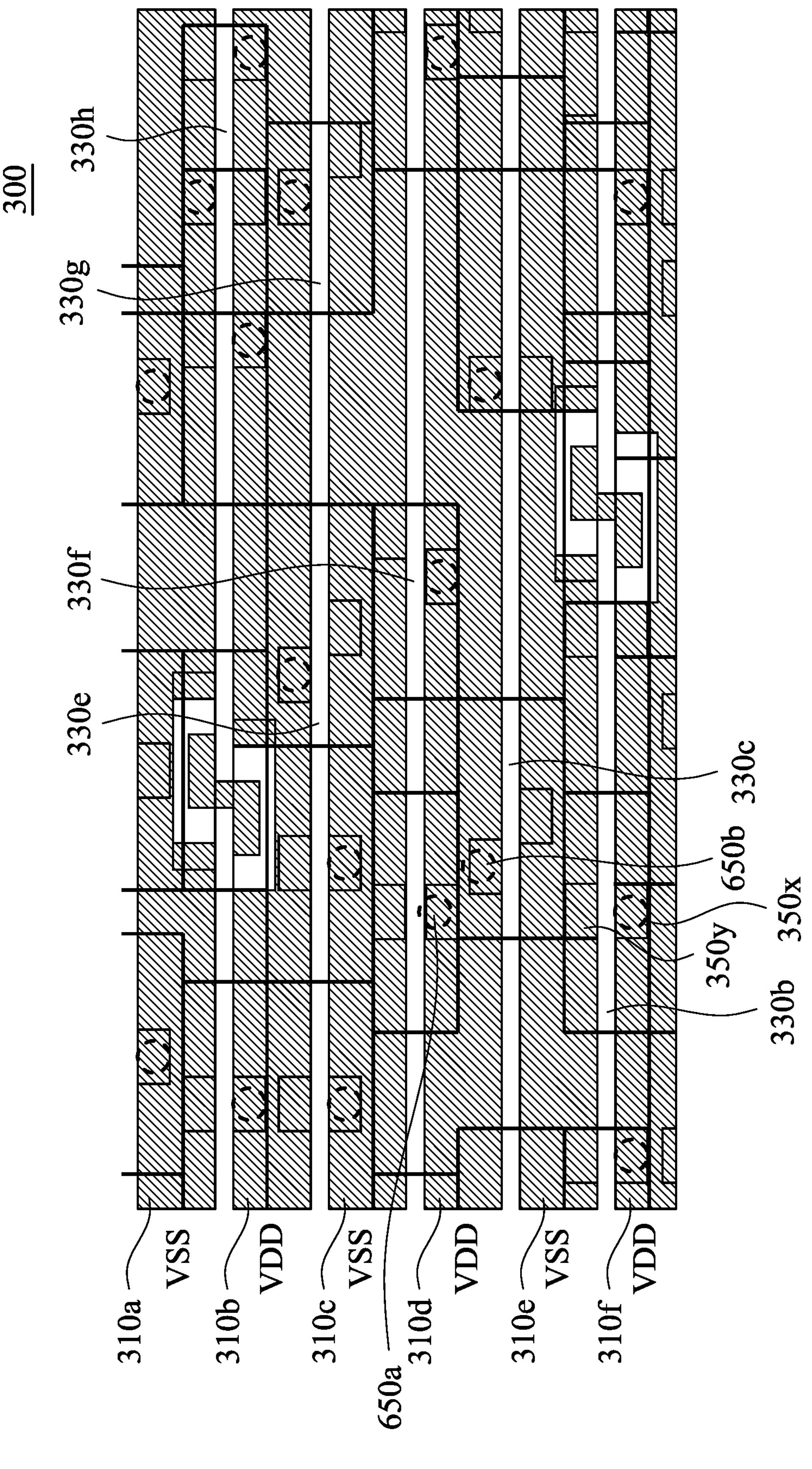
FIG. 6A-6B illustrate determining to not open areas that are permitted to open according to some embodiments.
Figure 6B:
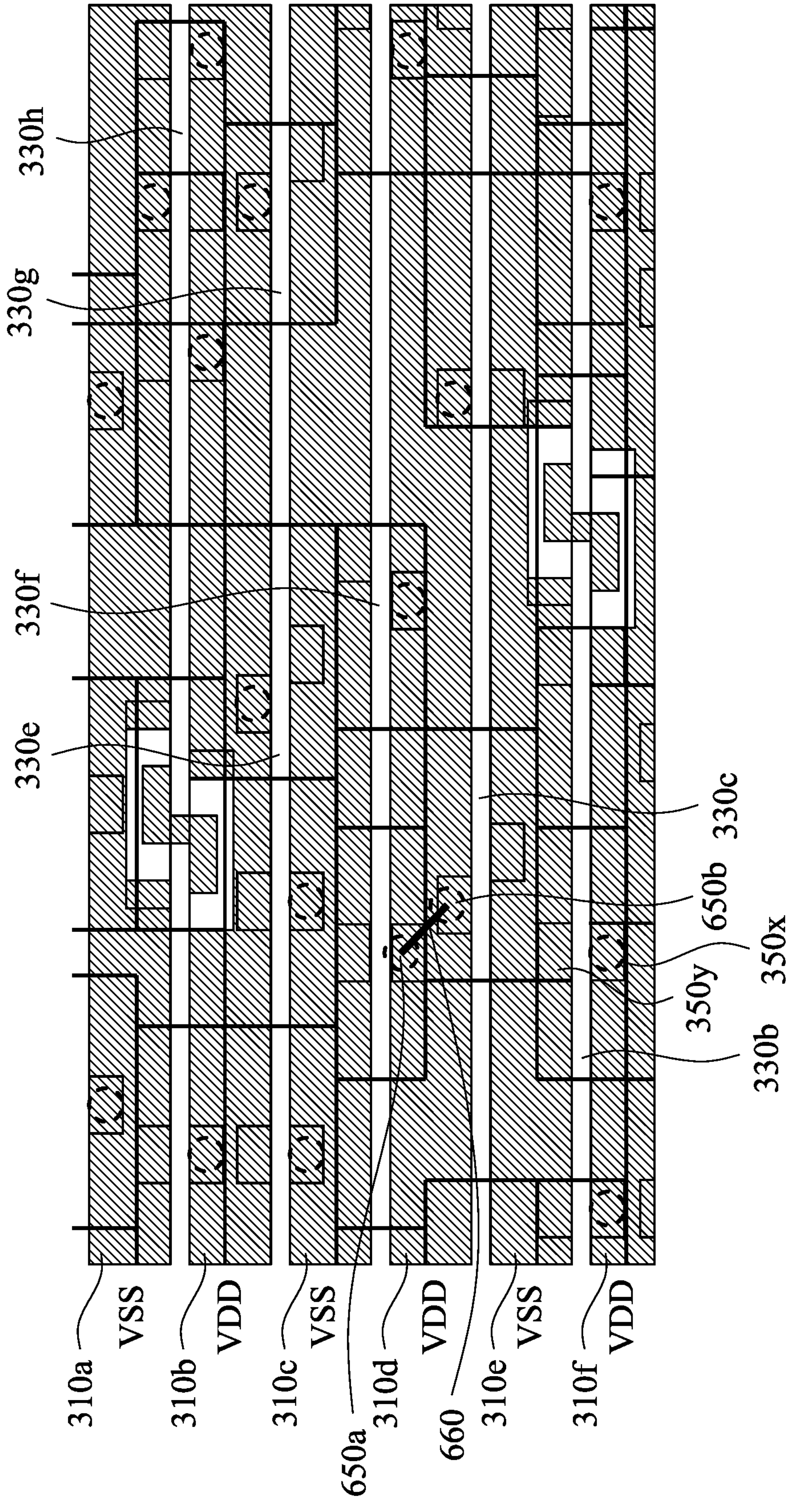

In the next step 738, certain ones of the designated open windows are selected as finalized open windows in an optimization process to enhance some aspect(s) or the IC device. For example, the processes described above may result in the designation of both open windows (one on the VDD side and one on the VSS side) in a cell as open, as is the case for the cells 303*b*, 303*c*, 303*e-h* in FIG. 6A. In such cases, with further reference to FIGS. 6B and 8C, the VDD-side or VSS-side window (e.g., 350*y*) is removed 842 as open window from each of the cells, and the remaining window (e.g., 350*x*) is designated as open. An exception is a situation in which the remaining windows (e.g., 650*b*) is in the same conductive line (e.g., VDD 310*d*) and closer to another open window (e.g., 650*a*) than the threshold distance such that the two open windows 650*a*, 650*b* are considered linked by a link 660. In such situation 834, one of the two open windows 650*a*, 650*b* is removed as open window. Such a process reduces the number of unnecessarily opened windows in the power lines, thereby reducing the resistance, and in turn, IR drop, of the power lines.

Next 846, in some embodiments, the pattern of the conductive layer (e.g., BM0) is altered to remove the portions corresponding to all potential open windows that remain designated as open through the process outlined above. The pattern can be stored in the form of one or more computer-readable media files, any suitable format, such as GDSII file format and DFII file format. In some embodiments, the layout of the IC device, including the altered pattern of the conductive layer, is used to control IC fabrication equipment to make IC devices of the stored layout, including the altered conductive layer.

Figure 9:
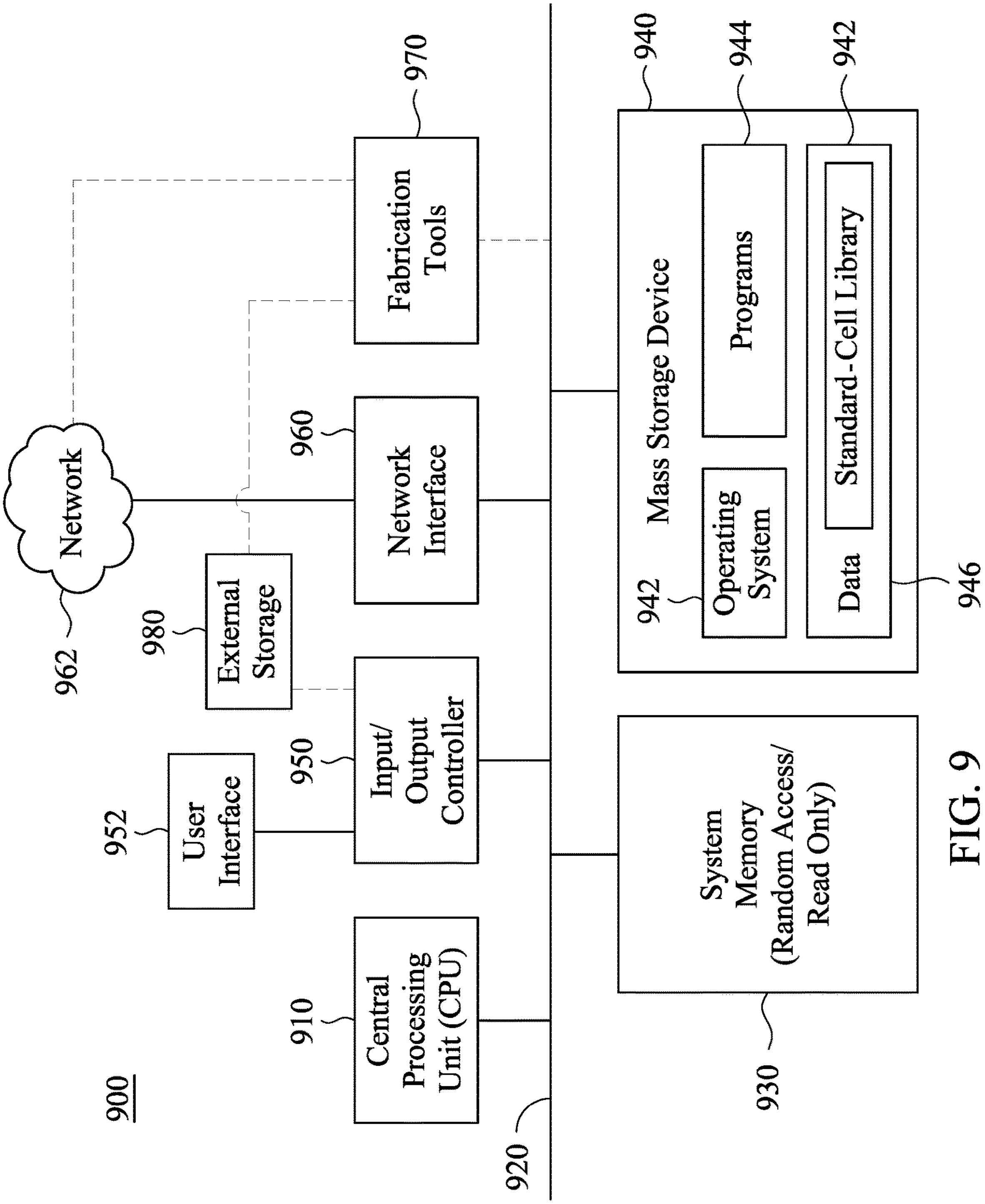
FIG. 9 shows a block diagram illustrating an example of a computer system in accordance with some embodiments.

As briefly mentioned above, the processes described above are carried out by a computer system, such as a computer system having electronic design automation (EDA) tools for automated placement and routing of devices. Such a computer system in some embodiment includes one or more special-purpose computers, which can be one or more general-purpose computers specifically programmed to perform the methods. For example, a computer 900 schematically shown in FIG. 9 can be used. The computer 900 includes a processor 910, which is connected to the other components of the computer via a data communication path such as a bus 920. The components include system memory 930, which is loaded with the instructions for the processor 910 to perform the methods described above. Included is also a mass storage device, which is a computer-readable storage medium 940. The mass storage device is an electronic, magnetic, optical, electromagnetic, infrared, and/or a semiconductor system (or apparatus or device). For example, the computer-readable storage medium 940 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer-readable storage medium 940 includes a compact disk-read only memory (CD-ROM), a compact disk-read/write (CD-R/W), and/or a digital video disc (DVD). The mass storage device 940 stores, among other things, the operating system 942; programs 944, including those that, when read into the system memory 920 and executed by the processor 910, cause the computer 900 to carry out the processes described above; and Data 946. Data 946 can include, for example, a standard cell library, which includes standard cells, such as NAND, NOR, INV (inverter), AOI (AND-OR-Inverter), and SDFQ (D flip-flop with scan input), design rules, status of the IC circuit design, including the current iteration of mask pattern. The computer 900 also includes an I/O controller 950, which input and output to a User Interface 952. The User Interface 952 can include a keyboard, mouse, display and any other suitable user interfacing devices. The I/O controller can have further input/out ports for input from, and/or output to, devices such as an External Storage device 980, which can be any memory device, including a semiconductor or solid-state memory device, a magnetic tape drive, a rigid magnetic disk drive, and/or an optical disk, such as a compact disk-read only memory (CD-ROM), a compact disk-read/write (CD-R/W), and/or a digital video disc (DVD). The computer can further include a network interface 960 to enable the computer to receive and transmit data from and to remote networks 962.

The computer system in some embodiments includes a Fabrication Tools module 970 for layout and physical implementation of the device fabrication as designed at least in part using the processes described above. The Fabrication Tools module 970 in some embodiments is a part of the computer 900 and is connected to the bus 920 and can receive the layout design stored in the Mass Storage device 940. In other embodiments, the Fabrication Tools module can be a system separate from the computer 900 but receive the layout design made by the computer 900 via the Network 962. In still further embodiments, the Fabrication Tools module can be a system separate from the computer 900 but receive the layout design made by the computer 900 from a External Storage device 980, such as a solid state storage device or an optical disk.

As noted above, the computer system, such as an EDA system (i.e., a computer system with EDA tools) in some embodiments includes fabrication tools 970 for implementing the processes and/or methods stored in the storage medium 940. For instance, a synthesis may be performed on a design in which the behavior and/or functions desired from the design are transformed to a functionally equivalent logic gate-level circuit description by matching the design to standard cells selected from the standard cell library 948. The synthesis results in a functionally equivalent logic gate-level circuit description, such as a gate-level netlist. Based on the gate-level netlist, a photolithographic mask may be generated that is used to fabricate the integrated circuit by the fabrication tools 970. Further aspects of device fabrication are disclosed in conjunction with FIG. 102, which is a block diagram of IC manufacturing system 1001, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using the manufacturing system 1001 (FIG. 102).

Figure 10:
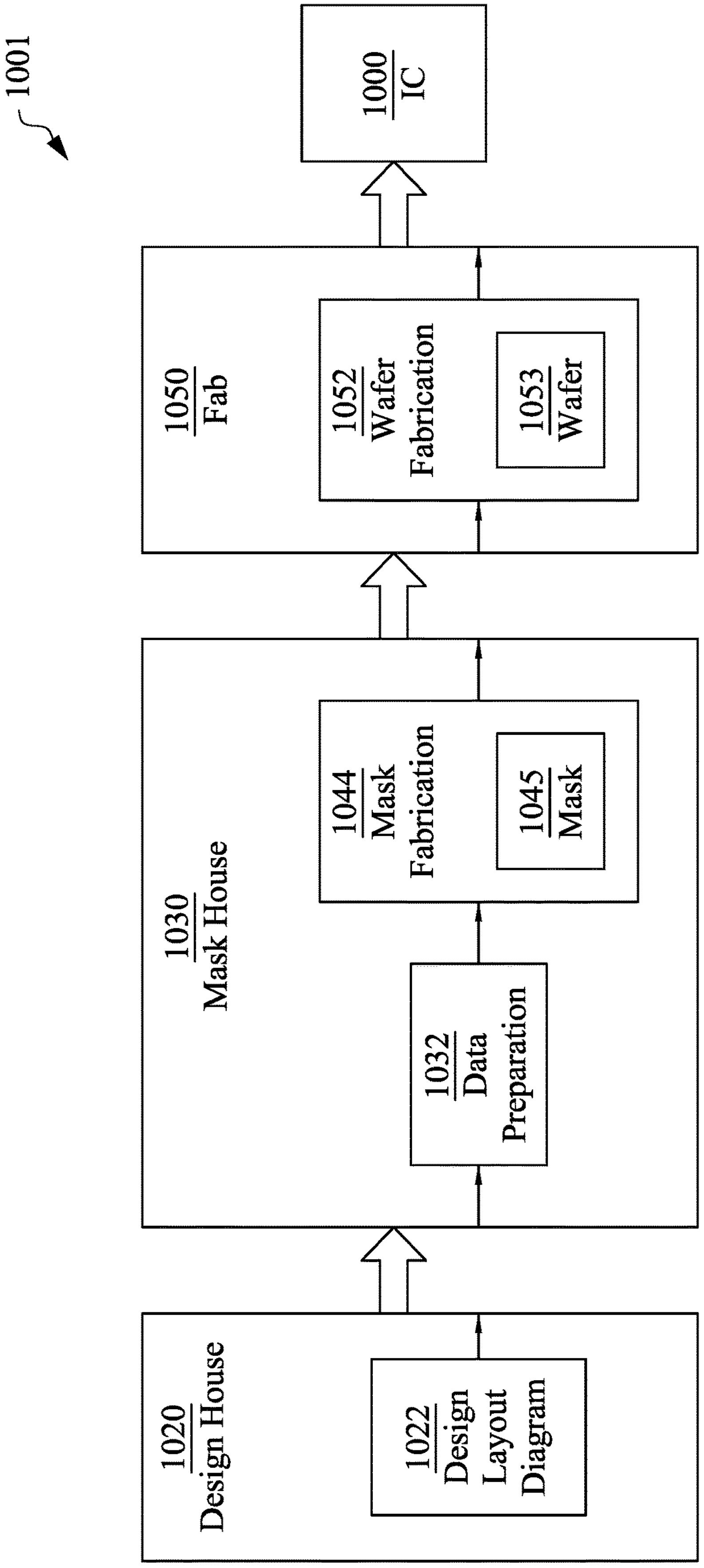
FIG. 10 shows a block diagram of an IC manufacturing system and an IC manufacturing flow associated therewith in accordance with some embodiments.

In FIG. 10, the IC manufacturing system 1001 includes entities, such as a design house 1020, a mask house 1030, and an IC manufacturer/fabricator ("fab") 1050, that interact with one another in the design, development, and manufacturing cycles and/or services related to manufacturing an integrated circuit (IC) 100, such as the devices disclosed herein. The entities in the system 1001 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of the design house 1020, mask house 1030, and IC fab 1050 is owned by a single entity. In some embodiments, two or more of design house 10100, mask house 1030, and IC fab 1050 coexist in a common facility and use common resources.

The design house (or design team) 1020 generates an IC design layout diagram 1022. The IC design layout diagram 1022 includes various geometrical patterns, or IC layout diagrams designed for an IC device, such as the IC device 100 discussed above. The geometrical patterns correspond to patterns of metal, oxide, or semiconductor layers that make up the various components of the IC device 100 to be fabricated. The various layers combine to form various IC features. For example, a portion of the IC design layout diagram 1022 includes various IC features, such as an active region (OD), gate electrode, source and drain, metal lines or local vias, and openings for bonding pads, to be formed in a semiconductor substrate (such as a silicon wafer) and various material layers disposed on the semiconductor substrate. The design house 1020 implements a design procedure to form an IC design layout diagram 1022. The design procedure includes one or more of logic design, physical design or place and route. The IC design layout diagram 1022 is presented in one or more data files having information of the geometrical patterns. For example, IC design layout diagram 1022 can be expressed in a GDSII file format or DFII file format.

The mask house 1030 includes a data preparation 1032 and a mask fabrication 1044. The mask house 1030 uses the IC design layout diagram 1022 to manufacture one or more masks 1045 to be used for fabricating the various layers of the IC device 100 according to the IC design layout diagram 1022. The mask house 1030 performs mask data preparation 1032, where the IC design layout diagram 1022 is translated into a representative data file ("RDF"). The mask data preparation 1032 provides the RDF to the mask fabrication 1044. The mask fabrication 1044 includes a mask writer. A mask writer converts the RDF to an image on a substrate, such as a mask (reticle) 1045 or a semiconductor wafer 1053. The design layout diagram 1022 is manipulated by the mask data preparation 1032 to comply with particular characteristics of the mask writer and/or requirements of the IC fab 1050. In FIG. 10, the mask data preparation 1032 and the mask fabrication 1044 are illustrated as separate elements. In some embodiments, the mask data preparation 1032 and the mask fabrication 1044 can be collectively referred to as a mask data preparation.

In some embodiments, the mask data preparation 1032 includes an optical proximity correction (OPC) which uses lithography enhancement techniques to compensate for image errors, such as those that can arise from diffraction, interference, other process effects and the like. The OPC adjusts the IC design layout diagram 1022. In some embodiments, the mask data preparation 1032 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 1032 includes a mask rule checker (MRC) that checks the IC design layout diagram 1022 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 1022 to compensate for limitations during the mask fabrication 1044, which may undo part of the modifications performed by OPC in order to meet mask creation rules.

In some embodiments, the mask data preparation 1032 includes lithography process checking (LPC) that simulates processing that will be implemented by the IC fab 1050 to fabricate the IC device 100. LPC simulates this processing based on the IC design layout diagram 1022 to create a simulated manufactured device, such as the IC device 100. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine the IC design layout diagram 1022.

It should be understood that the above description of mask data preparation 1032 has been simplified for the purposes of clarity. In some embodiments, data preparation 1032 includes additional features such as a logic operation (LOP) to modify the IC design layout diagram 1022 according to manufacturing rules. Additionally, the processes applied to the IC design layout diagram 1022 during data preparation 1032 may be executed in a variety of different orders.

After the mask data preparation 1032 and during the mask fabrication 1044, a mask 1045 or a group of masks 1045 are fabricated based on the modified IC design layout diagram 1022. In some embodiments, the mask fabrication 1044 includes performing one or more lithographic exposures based on the IC design layout diagram 1022. In some embodiments, an electron-beam (e-beam) or a mechanism of multiple e-beams is used to form a pattern on a mask (photomask or reticle) 1045 based on the modified IC design layout diagram 1022. The mask 1045 can be formed in various technologies. In some embodiments, the mask 1045 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of the mask 1045 includes a transparent substrate (e.g., fused quartz) and an opaque material (e.g., chromium) coated in the opaque regions of the binary mask. In another example, the mask 1045 is formed using a phase shift technology. In a phase shift mask (PSM) version of the mask 1045, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 1044 is used in a variety of processes. For example, such a mask(s) is used in an ion implantation process to form various doped regions in the semiconductor wafer 1053, in an etching process to form various etching regions in the semiconductor wafer 1053, and/or in other suitable processes.

The IC fab 1050 includes wafer fabrication 1052. The IC fab 1050 is an IC fabrication business that includes one or more manufacturing facilities for the fabrication of a variety of different IC products. In some embodiments, the IC Fab 1050 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 1050 uses mask(s) 1045 fabricated by the mask house 1030 to fabricate the IC device 100. Thus, the IC fab 1050 at least indirectly uses the IC design layout diagram 1022 to fabricate the IC device 100. In some embodiments, the semiconductor wafer 1053 is fabricated by the IC fab 1050 using mask(s) 1045 to form the IC device 100. In some embodiments, the IC fabrication includes performing one or more lithographic exposures based at least indirectly on the IC design layout diagram 1022. The Semiconductor wafer 1053 includes a silicon substrate or other proper substrate having material layers formed thereon. The semiconductor wafer 1053 further includes one or more of various doped regions, dielectric features, multilevel interconnects, and the like (formed at subsequent manufacturing steps).

Figure 11A:
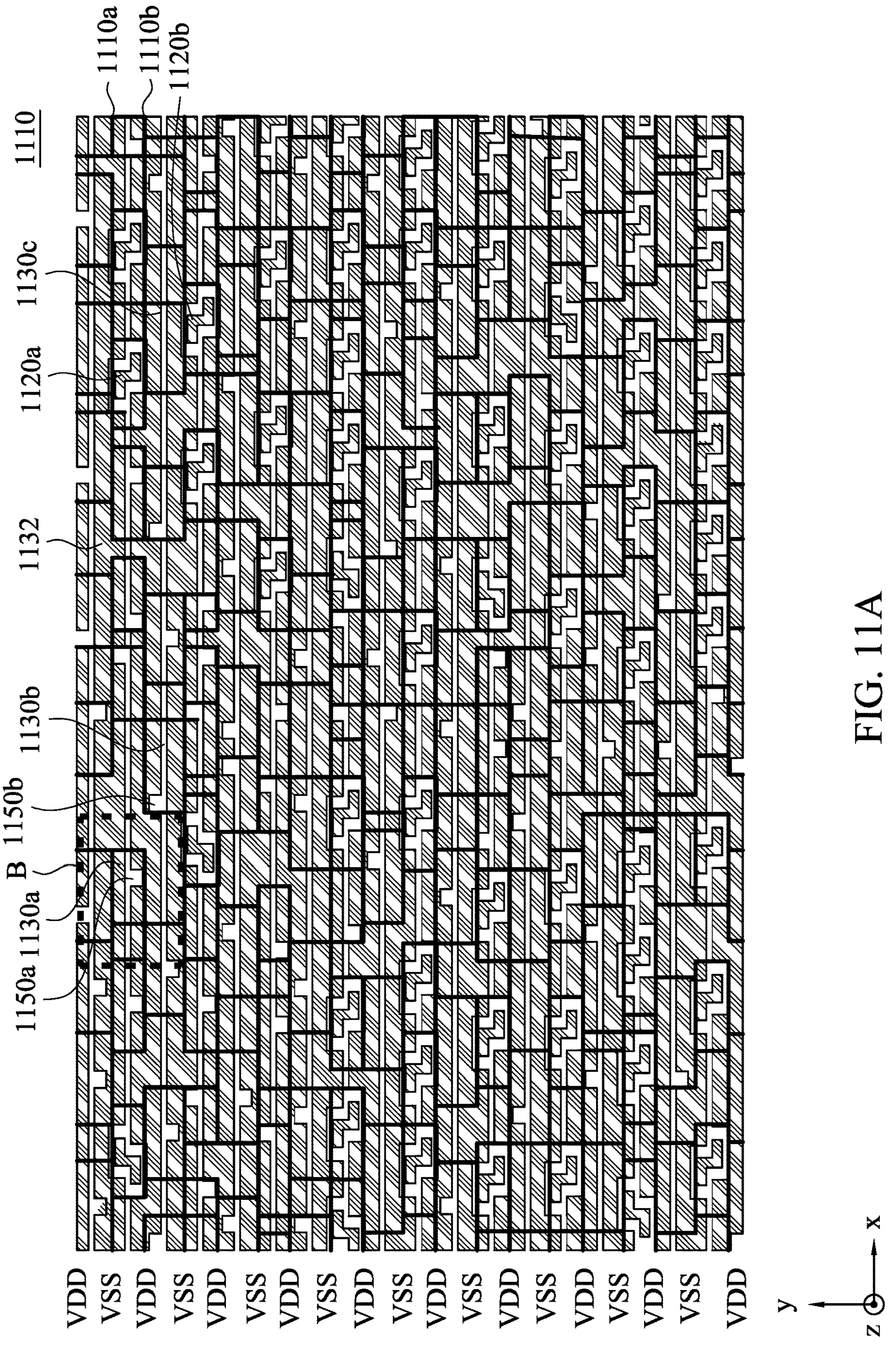
FIG. 11A shows a metal layer in an integrated circuit device according to some embodiments.
Figure 11B:
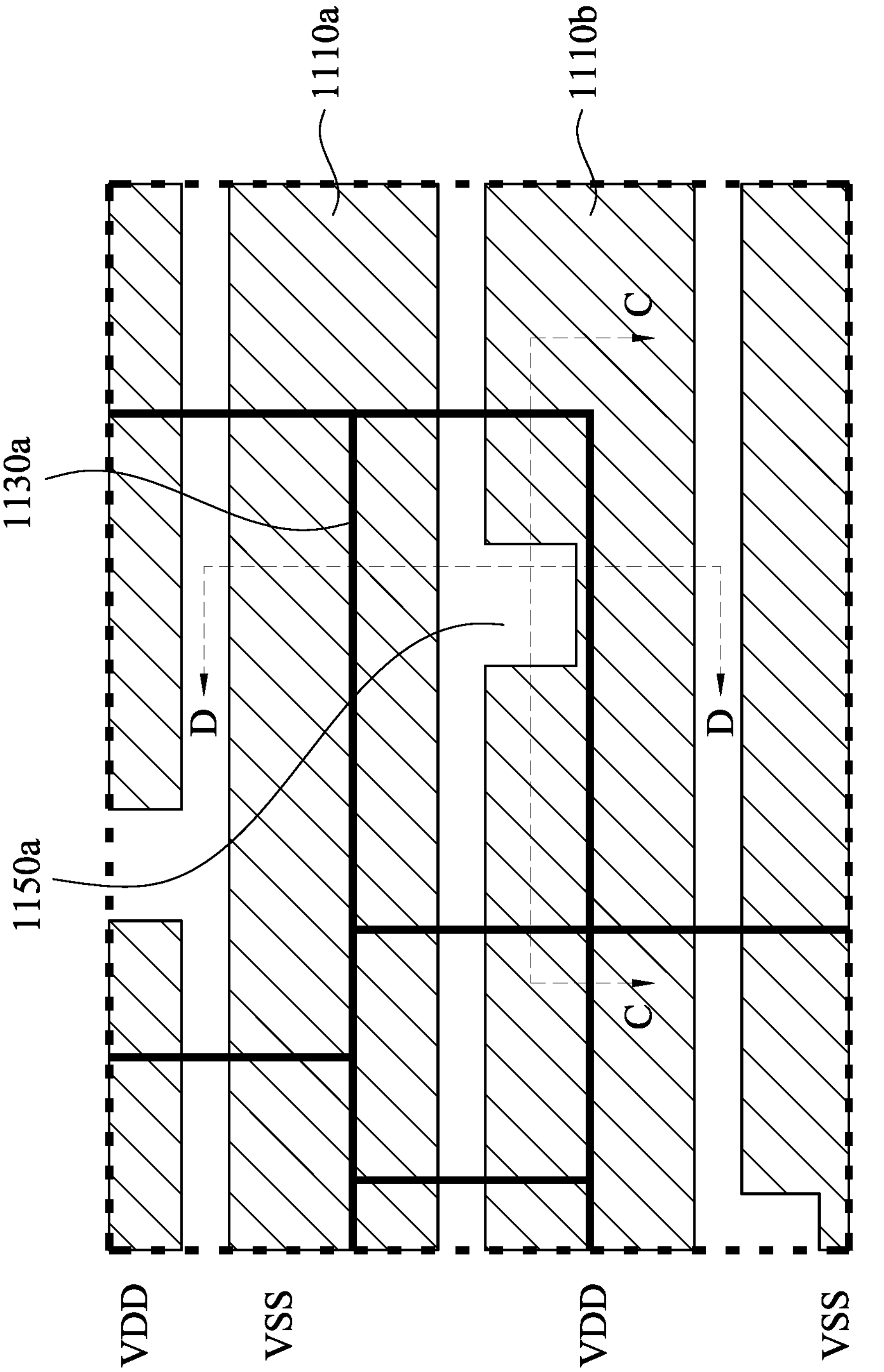
FIG. 11B shows an enlarged view of the metal layer portion labelled "B" in FIG. 11A.
Figure 11D:
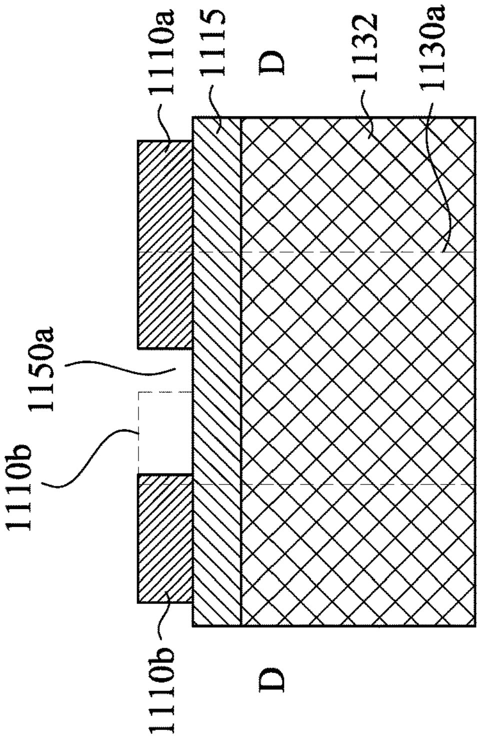
FIG. 11D shows the cross-section D-D of the integrated circuit device in FIGS. 11A and 11B.
Figure 11C:
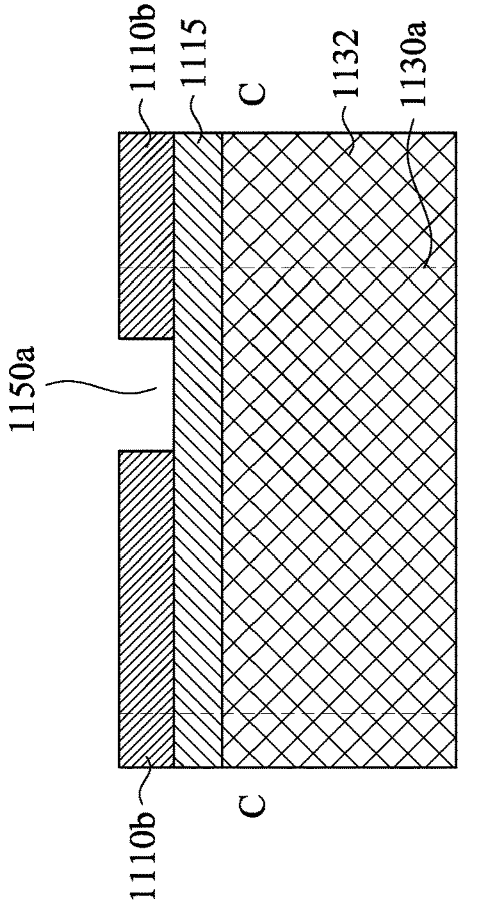
FIG. 11C shows the cross-section C-C of the integrated circuit device in FIGS. 11A and 11B.

FIG. 11A shows a layout pattern of a conductive (BM0) layer 1110 processed as outlined above, in some embodiments. The conductive lines VDD and VSS (e.g., VSS line 1110*a* and VDD line 1110*b*) in the conductive layer 1110 extend in the x-direction and are disposed on the backside of the semiconductor active layer that is divided in to rows of cells 1130 (e.g., 1130*a*, 1130*b*, 1130*c*) and fillers (e.g., 1132). In some embodiments, such as the one shown in the cross-sectional views C-C in FIG. 11C and D-D in FIG. 11D, the cross-sections taken from the region "B" in FIG. 11A, as shown in FIG. 11B, the metal layer, including conductive lines VSS 1110*a* and VDD 1110*b*, are disposed over a layer 1132, such as source/drain contacts (MD) similar to those 132*a*, 132*b*, 132*c* in FIG. 1. An insulating layer 1115 is disposed between the active layer 1132 and metal layer.

The conductive layer 1110 also includes signal lines 1120 (e.g., 1120*a*, 1120*b*). The conductive lines over some cells, such as cells 1130*a*, 1130*b* includes one opening 1150*a*, 1150*b*, respectively, in each cell. The conductive lines over other cells, such as cell 1130*c*, includes no opening. In the example of cell 1130*c*, the cell borders on both sides in the y-direction by signal lines 1120*a*, 1120*b*. As a result, the power lines for the cell encroaches into the forbidden zones of the signal lines, and no potential open window can be identified within the cell 1130*c*.

Figure 12A:
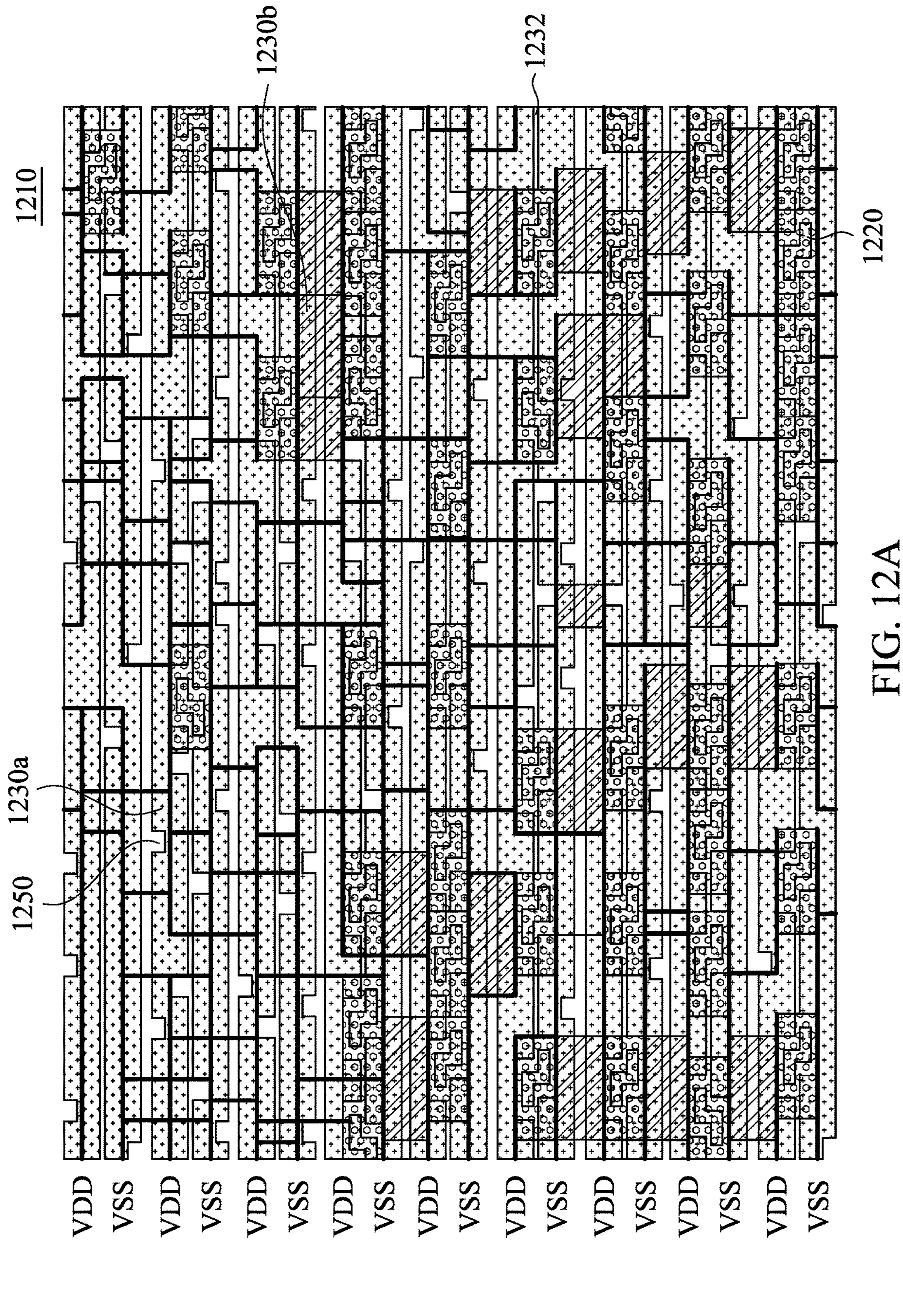
FIGS. 12A-12B show metal layers in respective integrated circuit devices according to some embodiments.
Figure 12B:
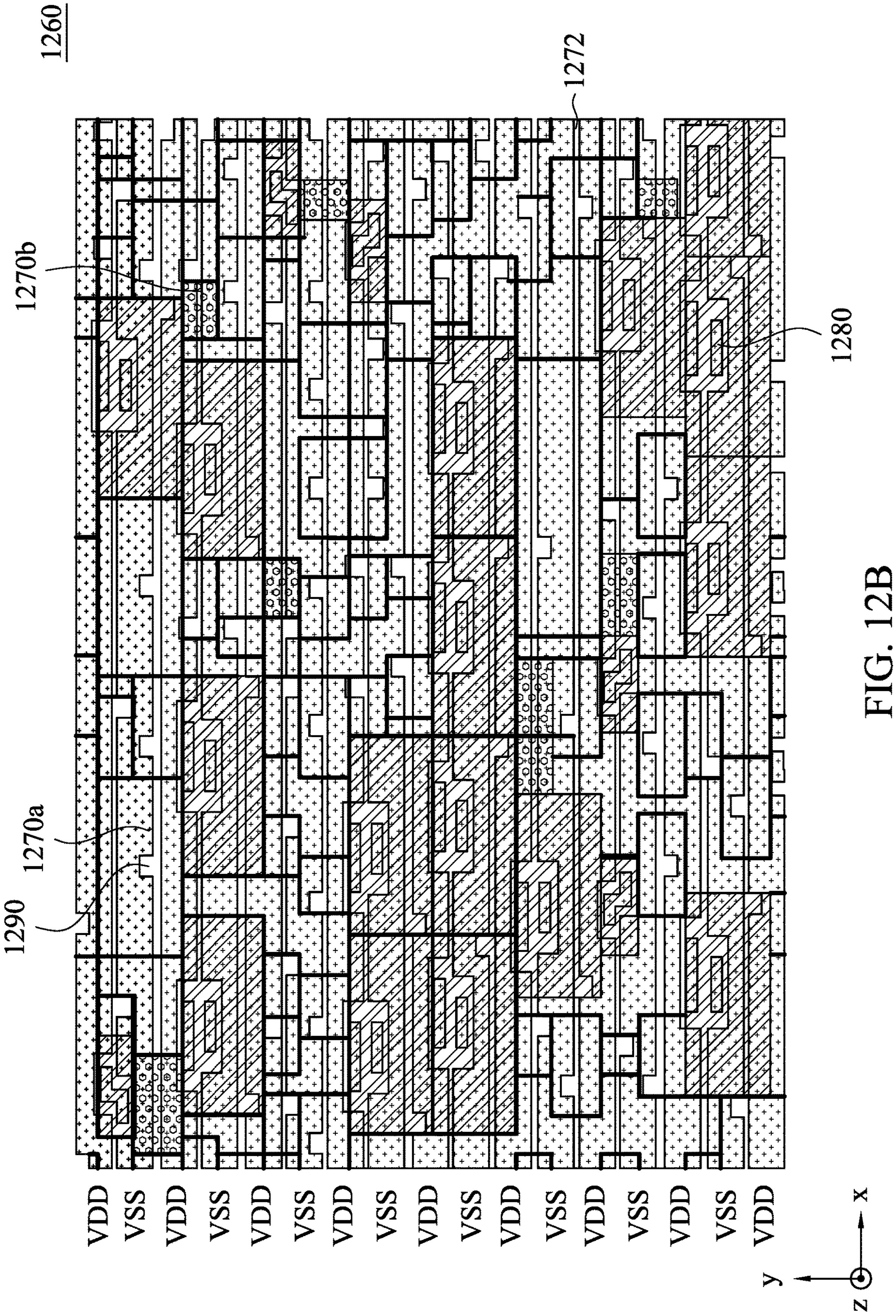

FIGS. 12A and 12B show, respectively, show layout patterns of conductive (BM0) layers 1210, 1260 processed as outlined above, in some embodiments. In FIG. 12A, the conductive lines VDD and VSS in the conductive layer 1210 extend in the x-direction and are disposed on the backside of the semiconductor active layer that is divided in to rows of cells 1230 (e.g., 1230*a*, 1130*b*) and fillers (e.g., 1232). The conductive layer 1210 also includes cells that include signal lines (e.g., 1220). The conductive lines over some cells, such as cells 1130*a*, includes one opening 1250 in each cell. The conductive lines over other cells, such as cell 1230*b*, includes no opening. In the example of cell 1230*b*, the cell borders on both sides in they-direction by signal lines. As a result, the power lines for the cell encroaches into the forbidden zones of the signal lines, and no potential open window can be identified within the cell 1230*b*. The example layout in FIG. 12A has a cell detection rate, i.e., the fraction of cells the active semiconductor regions are exposed by openings in the conductive layer 1210, of about 89.2%.

Similarly, in FIG. 12B, the conductive lines VDD and VSS in the conductive layer 1260 extend in the x-direction and are disposed on the backside of the semiconductor active layer that is divided in to rows of cells 1270 (e.g., 1270*a*, 1270*b*) and fillers (e.g., 1272). The conductive layer 1260 also includes cells that include signal lines (e.g., 1280). The conductive lines over some cells, such as cells 1270*a*, includes one opening 1290 in each cell. The conductive lines over other cells, such as cell 1270*b*, includes no opening. In the example of cell 1270*b*, the cell borders on both sides in the y-direction by power lines with openings. As a result, no potential open window can be identified within the cell 1270*b*. The example layout in FIG. 12B has a cell detection rate of about 96.8%.

Figure 13A:
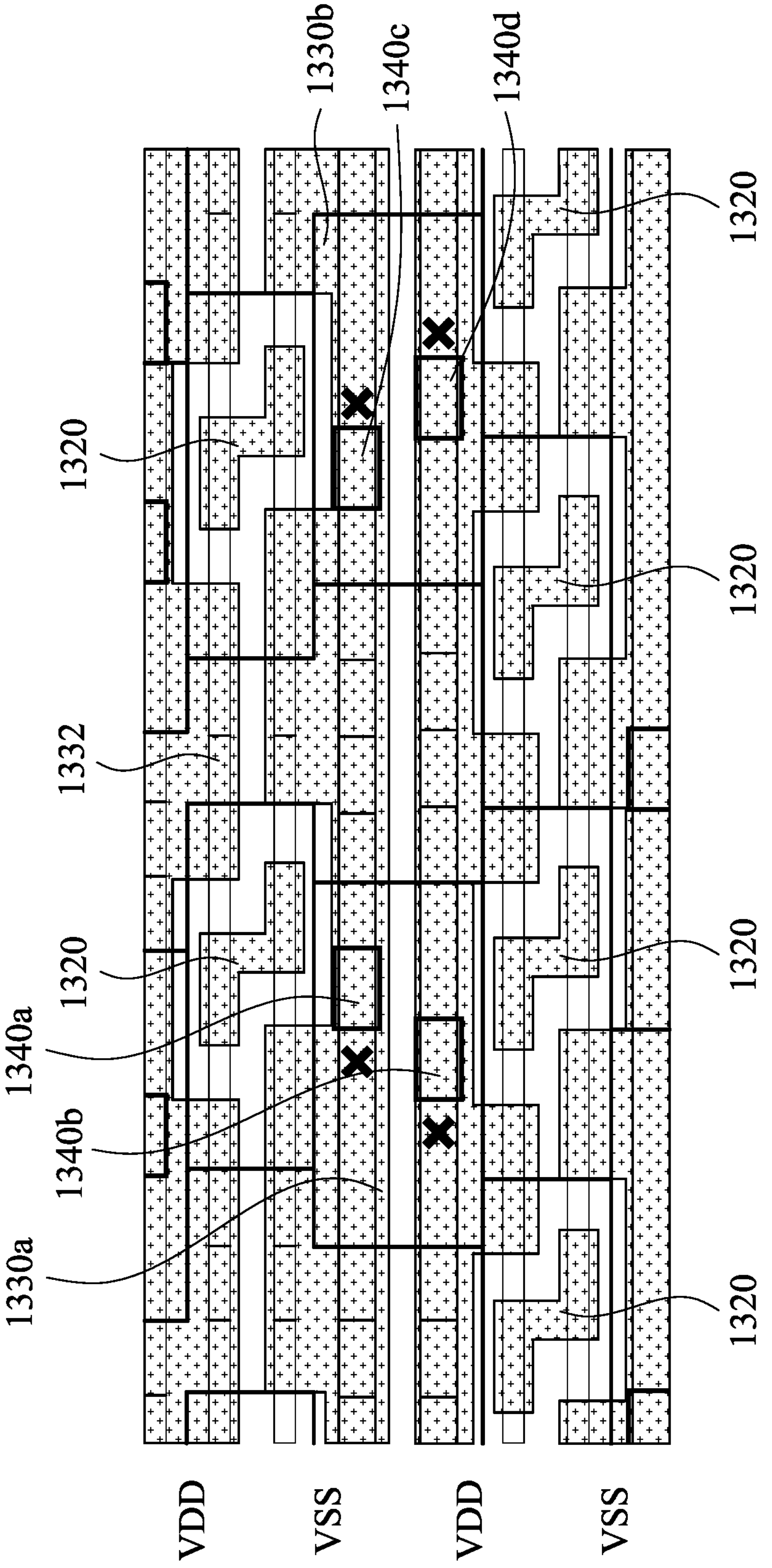
Figure 13B:
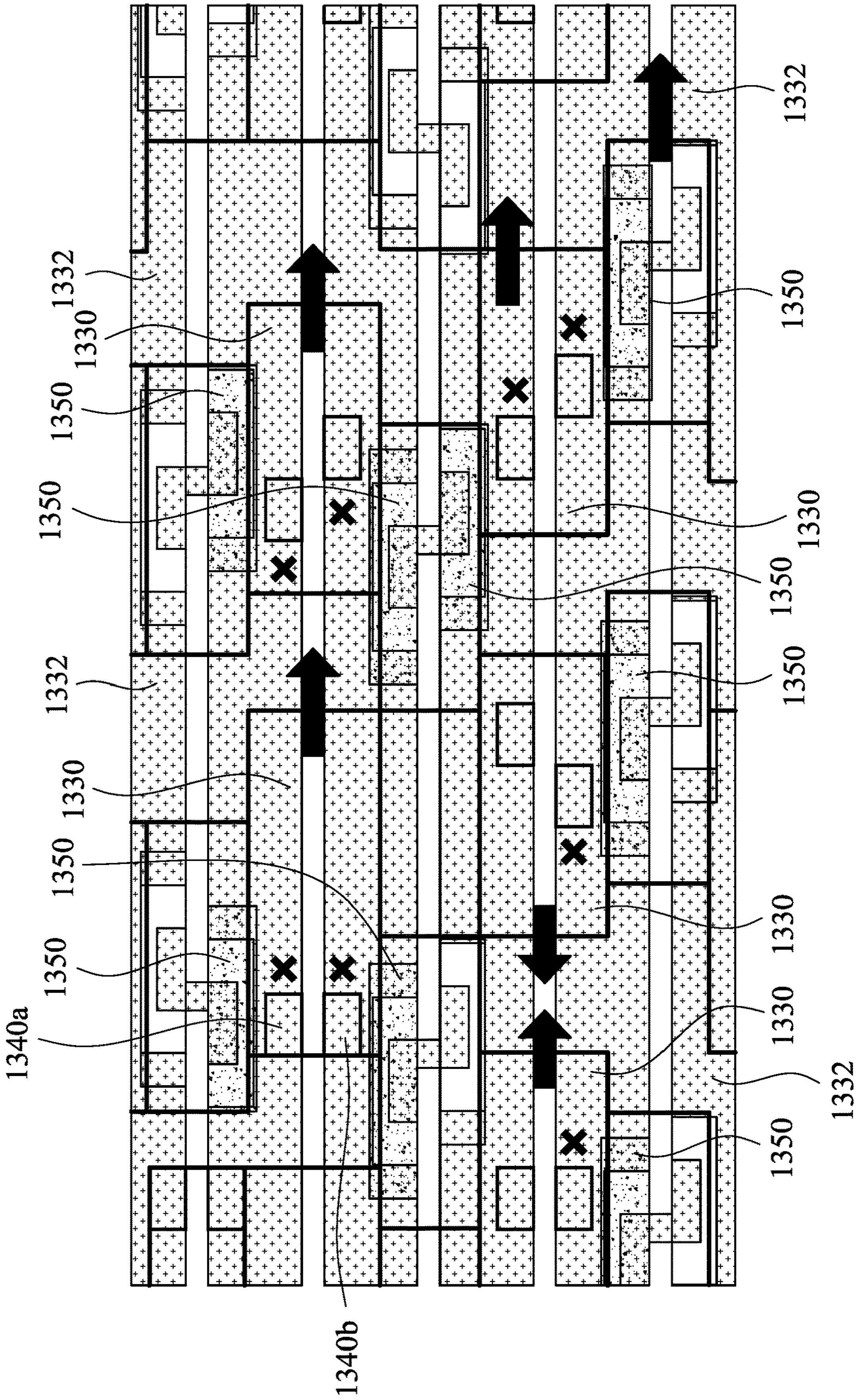

In some embodiments, as briefly mentioned above in reference to FIG. 7, placement and routing 720 after the step 710 of identifying potential open windows and forbidden windows and before the pro-processing steps 730 can be taken to increase the number of potential open windows. For example, in certain configurations, such as the one shown in FIG. 13A, otherwise potential open windows 1340*a-d* in certain respective cells 1330*a*, 1330*b* are forbidden due to constraints such as signal lines 1320 in neighboring cells. However, in certain situations, filler space 1332 may provide opportunities to reposition certain cells 1330*a*, 1330*b* and open at least some of the otherwise forbidden windows. Thus, as illustrated in FIG. 13B, in a placement and routing step 720 in some embodiments, cells 1330 are shifted toward available filler spaces 1332 in the directions of the arrows to reposition the forbidden windows (e.g., 1340*a*, 1340*b*) in the cells 1330 to outside the forbidden zones 1350. Outside the forbidden zones, the forbidden windows (e.g., 1340*a*, 1340*b*) become potential open windows.

Figure 14A:
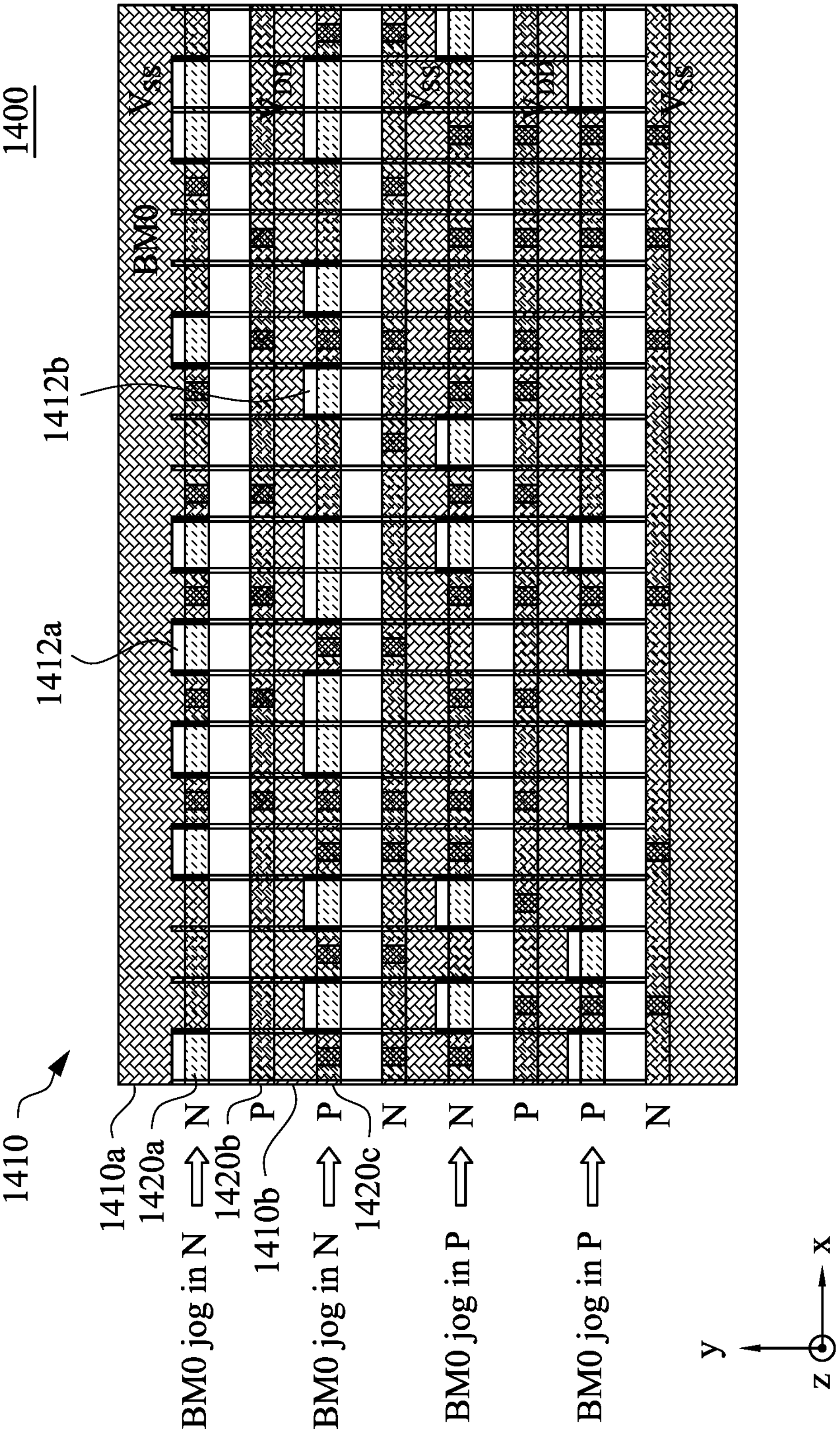
FIG. 14A-14E illustrate a process for determining areas to open in a metal layers in an integrated circuit device according to some embodiments.
Figure 14B:
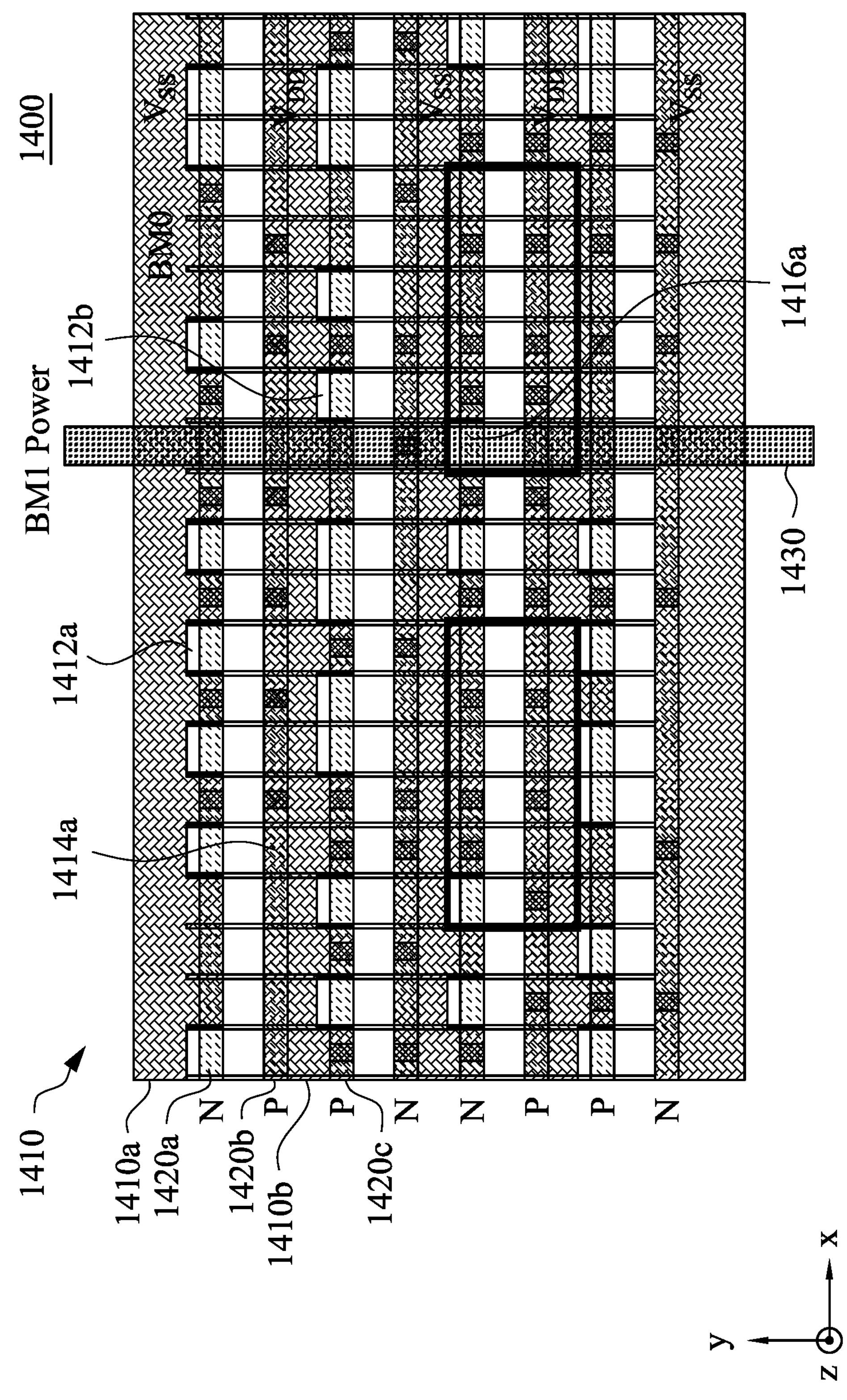
Figure 14C:
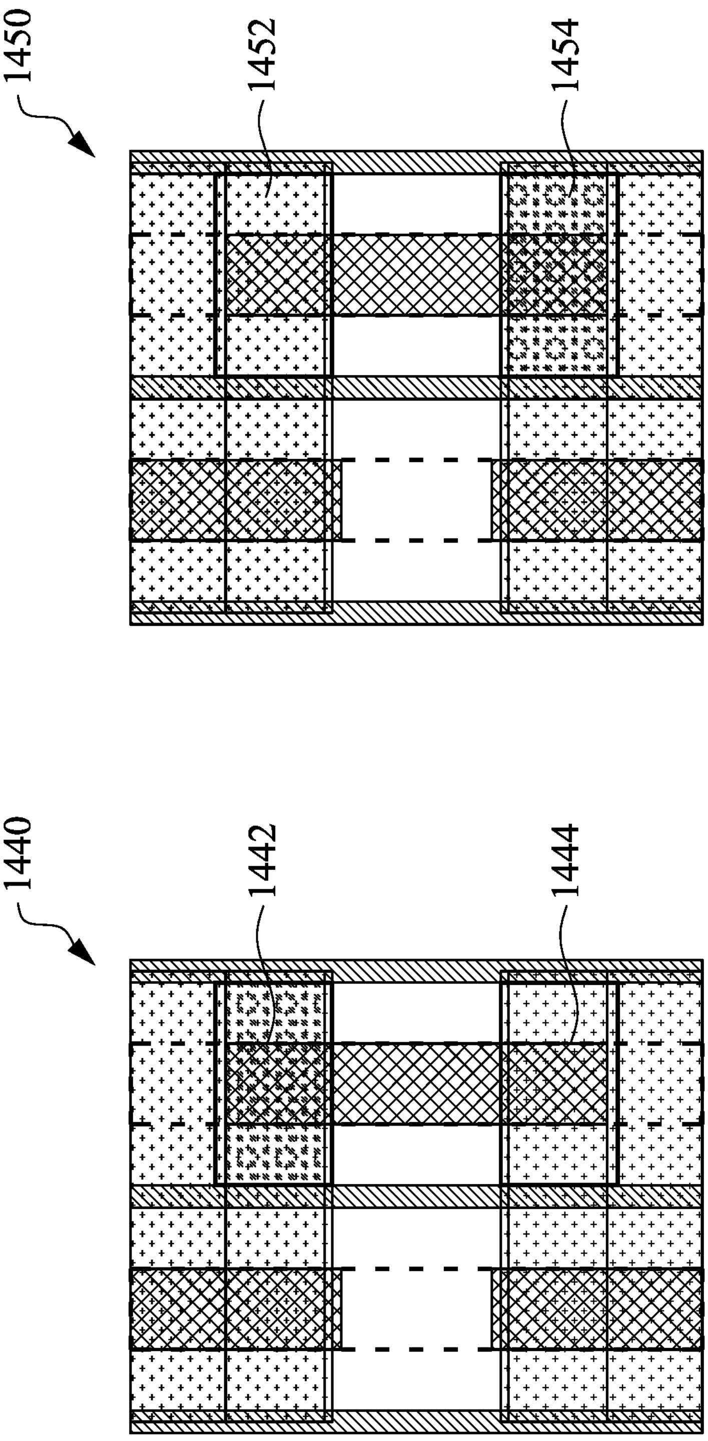
Figure 14D:
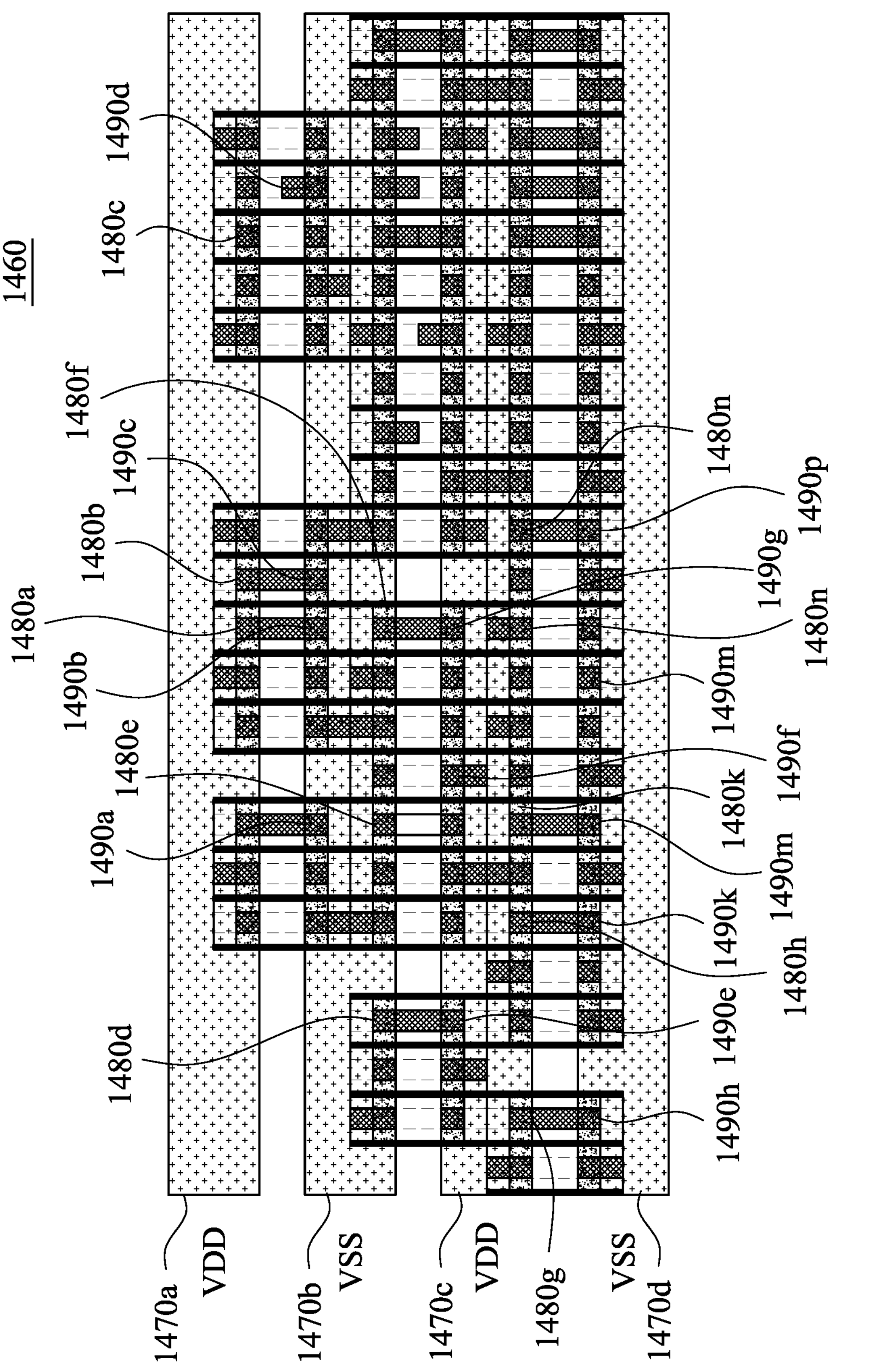
Figure 14E:
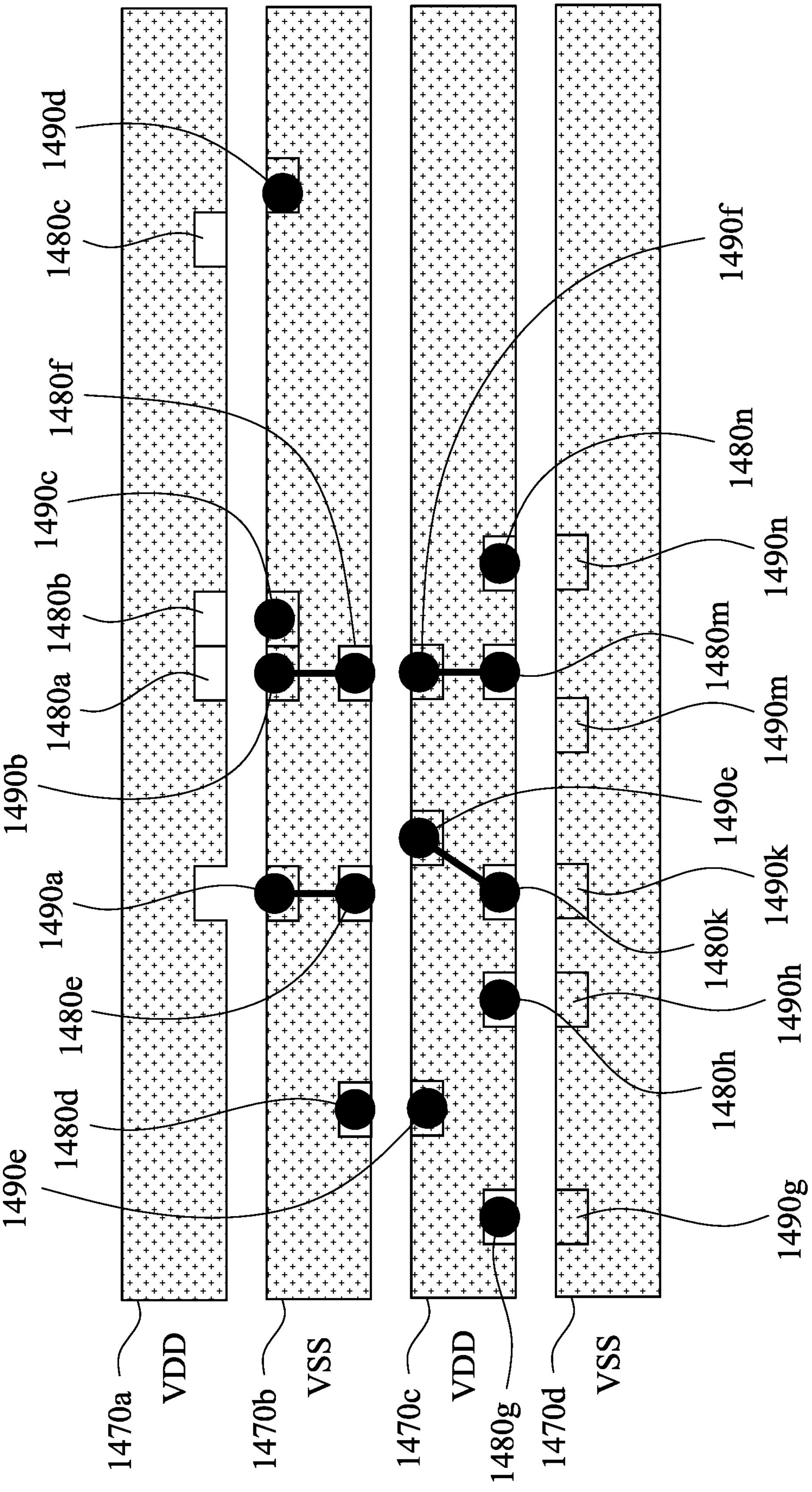
Figure 15:
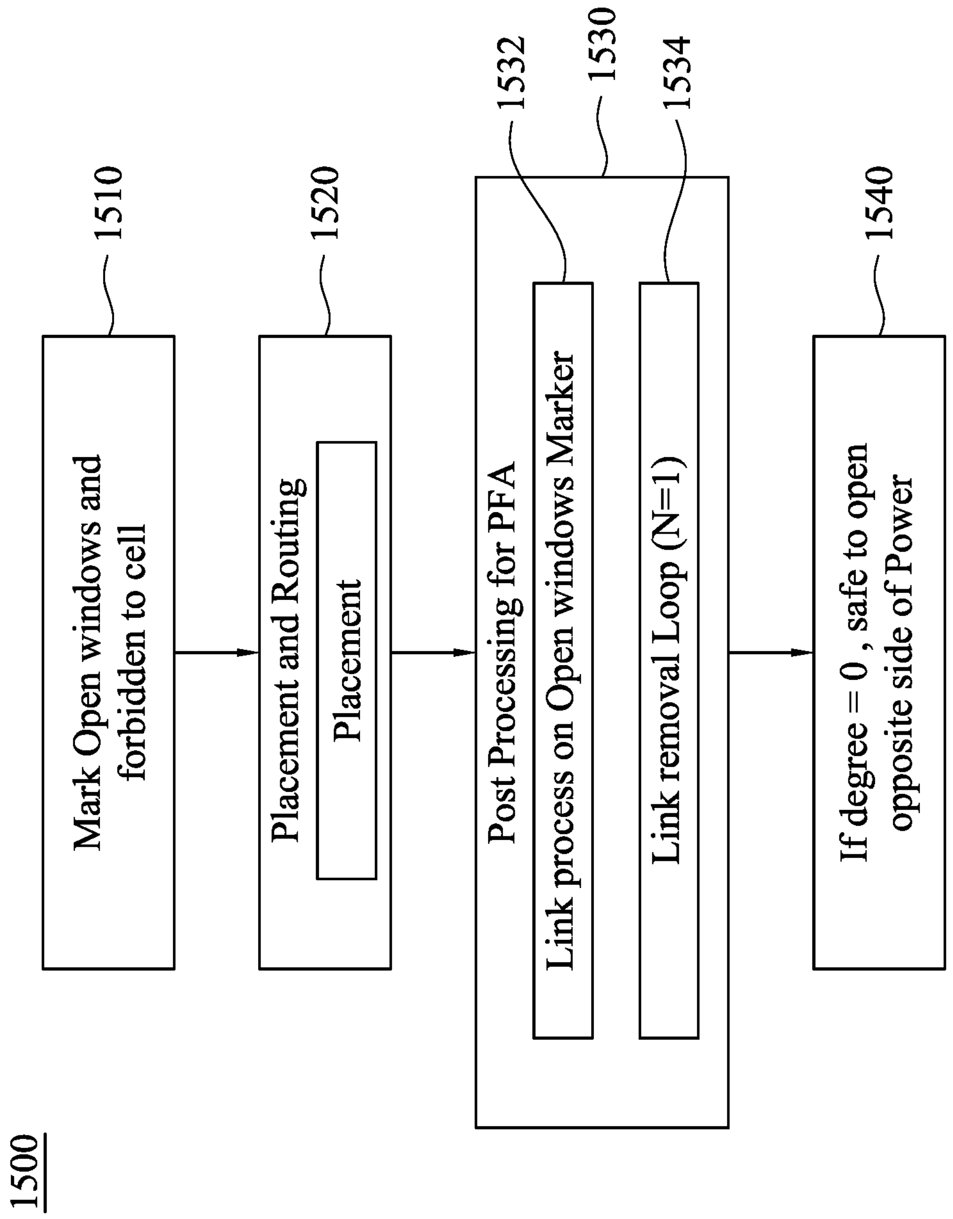
FIG. 15 outlines the process illustrated in FIGS. 14A-14E according to some embodiments.

In some embodiments, as illustrated in FIGS. 14A-E and outline in FIG. 15, portions of conductive layers (e.g., BM0) in certain conventional layouts are opened 1500 (FIG. 15) to increase the number of semiconductor devices that can be subjected to PFA. In certain designs, as shown in FIG. 14A, an IC device 1400 includes a conductive layer (BM0) 1410 on the backside of the active semiconductor layer, which includes N-type regions (e.g., 1420*a*) and P-type regions (e.g., 1420*b*, 1420*c*). The conductive layer 1410 includes conductive power lines VSS (e.g., 1410*a*) and VDD (e.g., 1410*b*), each covering a pair of N-type regions and a pair of P-type regions (except at the edge of the device), respectively. Each conductive power line 1410*a*, 1410*b* can have opening ("jogs"), such as the jog 1412*a* over the N-type region and jog 1412*b* over the P-type region 1420*c*, on one side (in the y-direction) but not on the other. Thus one of the pair of N-type or P-type regions is completely covered by the respective conductive power line. For example, whereas some windows are open in BM0 over the P-type region 1420*c* in the pair of P-type regions covered by the VDD line 1410*b*, the other P-type region 1420*b* is completely covered by the VDD line 1410*b*. Thus, as shown in FIG. 14B, while portions of some portions of one of the P-N pair of active regions are exposed by jogs, none in the other one of the P-N pair is exposed. For example, jog 1412*a* exposes a portion of the N-type region 1420*a*, but the entirety of the paired P-type region 1420*b*, including the portion 1414*a*, is obscured. In addition, even if a portion of a semiconductor region, such as the portion 1416*a*, is exposed by a jog in one conductive layer, such as BM0, it may be obscured by another conductive layer, such as BM1 1430.

To increase the number of cells that can be tested, in some embodiments, potential open windows and any forbidden windows are identified 1510 (FIG. 15). In the examples shown in FIG. 14C, the outputs of inverters 1440, 1450 each have an open window 1442, 1454 at one end of the MD in the conventional layout; at the other end are the respective potential open windows 1444, 1452. In some embodiments, as illustrated in FIG. 4B, both the opened windows 1480*a-h*, 1480*k*, 1480*m*, 1480*n* and potential open windows 1490*a-h*, 1490*k*, 1490*m*, 1490*n*, 1490*p* are identified in the conductive lines 1470*a-d*.

Next, an optional placement and routing step 1520 (FIG. 15) similar to the placement and routing process 720 (FIG. 7) described above is carried out, after which a set 1530 of post-processing steps are carried out to identify any potential open windows to open. First, links are identified in a similar process 1532 as the process 732 (FIG. 7) and isolated potential open windows (link number 0) are designated as open. As illustrated in FIG. 14E, windows in the same conductive line and spaced apart by a distance equal to or less than a threshold distance, such as 1.5 times the poly pitch in some embodiments, are deemed linked. Thus in this example, potential open window 1490*a* is linked to open window 1480*e*; potential open window 1490*b* is linked to open window 1480*f*; potential open window 1490*e* is linked to open window 1480*k*; potential open window 1490*f* is linked to open window 1480*m*. Next a link removal process 1534 is carried out to iteratively remove links to generate additional isolated potential open windows. The process is similar to the process 734 (FIGS. 7 and 8A) except that the opened windows 1480*a-h*, 1480*k*, 1480*m*, 1480*n* are treated as potential open windows in this step. Any potential open window that is linked to an opened window cannot be opened. Any potential open window that is positioned directly across an opened window in a neighboring conductive line is also not to be opened.

Next, any remaining isolated windows designated as open are determined to be windows to be opened. In the example shown in FIG. 4E, isolated window 1490*d* has no link to any other window and is not positioned directly across any opened window in the neighboring conductive line 1470*a*. The window 1490*d* thus can be opened, resulting in a conductive line 1470*b* that is jogged, or has openings on both edges.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

(a) receiving, by an electronic design automation (EDA) system comprising an EDA tool comprising instructions stored in a storage medium in a computer, an integrated circuit layout comprising an active semiconductor layer comprising a plurality of semiconductor cells and a conductive power grid layer over the active semiconductor layer, the conductive power grid layer comprising a plurality of conductive lines for distributing power to the plurality of semiconductor cells;

(b) identifying, by the electronic design automation (EDA) system, a plurality of portions of the conductive power grid layer as potentially removable from the conductive power grid layer, the identified portions each covering a respective region of a respective semiconductor cell, each of the potentially removable portions being positioned over a respective portion of a respective one of the plurality of semiconductor cells;

(c) for each pair of the potentially removable portions, determining, by the electronic design automation (EDA) system, that the pair of potentially removable portions bear a spatial relationship with each other that satisfies at least one first predetermined condition;

(d) for each one of the potentially removable portions, determining, by the electronic design automation (EDA) system, a number of other ones of the plurality of potentially removable portions with which it bears a spatial relationship that satisfies at least the first predetermined condition;

(e) selecting, by the electronic design automation (EDA) system, a subset of the plurality of potentially removable portions as being removable from the conductive power grid layer at least in part based on the number of other ones of the plurality of potentially removable portions with which each one of the plurality of potentially removable portions bears a spatial relationship that satisfies at least the first predetermined condition;

(f) altering, by the electronic design automation (EDA) system, the integrated circuit layout by removing at least a subset of the removable portions from the conductive power grid layer to expose the respective regions; and (g) outputting, from the electronic design automation (EDA) system, to an integrated circuit fabrication tool the altered integrated circuit layout to configure the integrated circuit fabrication tool to fabricate an integrated circuit according to the altered integrated circuit layout.

2. The method of claim 1, wherein the at least one first predetermined condition comprises that the pair of potentially removable portions are spaced apart by a distance no greater than a predetermined threshold distance.

3. The method of claim 2, wherein:

the at least one first predetermined condition further comprises that the pair of identified portions are located on the same one of the plurality of conductive lines.

4. The method of claim 2, wherein the selecting a subset of the plurality of potentially removable portions as being removable from the conductive power grid layer comprises selecting from the plurality of potentially removable portions at least one potentially removable portion spaced apart from all other ones of the plurality of potentially removable portions by distances greater than the predetermined threshold distance as removable from the conductive power grid layer.

5. The method of claim 1, wherein:

each of the plurality of conductive lines is a power line covering at least a portion of at least one of the cells;

determining that one of the previously identified plurality of potentially removable portions as nonremovable is located over the same cell as one of the removable portions; and the identifying plurality of portions of the conductive power grid layer as potentially removable from the conductive power grid layer comprises identifying the one of the previously identified plurality of potentially removable portions determined to be located over the same cell as one of the removable portions as nonremovable.

6. The method of claim 2, further comprising, for each pair of potentially removable portions that are spaced apart by a distance no greater than a predetermined threshold distance, selecting one or both potentially removable portions in the pair as being removable from the conductive power grid layer at least in part based on a directional relationship between the pair.

7. The method of claim 6, wherein:

the conductive lines extend in a first direction and are spaced apart from each other in a second direction transverse to the first direction; and the selecting one or both potentially removable portions in the pair as being removable from the conductive power grid layer is at least in part based on a direction along which the removable portions in the pair are spaced apart relative to the first direction.

8. The method of claim 7, wherein the selecting one or both potentially removable portions in the pair as being removable from the conductive power grid layer comprises:

determining that the direction along which the removable portions in the pair are spaced apart not parallel to the first direction;

selecting both potentially removable portions in the pair spaced apart along the direction determined to be parallel to the first direction as being removable from the conductive power grid layer;

determining that the direction along which the removable portions in the pair are spaced apart is not parallel to the first direction; and selecting only one of the potentially removable portions in the pair spaced apart along the direction determined to be not parallel to the first direction as being removable from the conductive power grid layer.

9. The method of claim 1, wherein:

the conductive lines extend in a first direction and are spaced apart from each other in a second direction transverse to the first direction, each of the plurality of conductive lines having two edges extending along the first direction; and the selecting a subset of the plurality of potentially removable portions as being removable from the conductive power grid layer comprises selecting at least one potentially removable portion along the first edge of at least one of the conductive lines and at least one potentially removable portion along the second edge of the at least one of the conductive lines as removable from the conductive power grid layer.

10. The method of claim 1, further comprising repeating steps (b) through (f) prior to step (g).

11. The method of claim 1, further comprising receiving the output altered design and manufacturing an integrated circuit based on the altered design.

12. A system, comprising:

a processor;

a non-transient computer readable medium accessible by the processor, the non-transient computer readable medium storing instructions that when executed by the processor implement a method, comprising:

receiving an integrated circuit layout indicative of an arrangement of a plurality of semiconductor cells and a conductive power grid layer comprising a plurality of conductive lines for distributing power to the plurality of semiconductor cells;

identifying a plurality of portions of the conductive power grid layer as potentially removable from the conductive power grid layer, each of the potentially removable portions being positioned over a respective portion of a respective one of the plurality of semiconductor cells, the identified portions each covering a respective region of a respective semiconductor cell;

for each pair of the potentially removable portions, determining whether the pair of potentially removable portions bear a spatial relationship with each other that satisfies at least one first predetermined condition;

for each one of the potentially removable portions, determining a number of other ones of the plurality of potentially removable portions with which it bears a spatial relationship that satisfies at least the first predetermined condition;

selecting a subset of the plurality of potentially removable portions as being removable from the conductive power grid layer as least in part based on the number of other ones of the plurality of potentially removable portions with which each one of the plurality of potentially removable portions bears a spatial relationship that satisfies at least the first predetermined condition;

altering the integrated circuit layout by removing at least a subset of the removable portions from the conductive power grid layer to expose the respective regions;

outputting to an integrated circuit fabrication tool an altered integrated circuit layout to configure the integrated circuit fabrication tool to fabricate an integrated circuit according to the altered integrated circuit layout; and fabricating, by the integrated circuit fabricating tool, an integrated circuit device according to the altered integrated circuit layout.

13. The system of claim 12, wherein the at least one first predetermined condition comprises that the pair of potentially removable portions are spaced apart by a distance no greater than a predetermined threshold distance.

14. The system of claim 13, wherein the selecting a subset of the plurality of potentially removable portions as being removable from the conductive power grid layer comprises selecting from the plurality of potentially removable portions at least one potentially removable portion spaced apart from all other ones of the plurality of potentially removable portions by distances greater than the predetermined threshold distance as removable from the conductive power grid layer.

15. The system of claim 14, wherein the method further comprising, for each pair of potentially removable portions that are spaced apart by a distance no greater than a predetermined threshold distance, selecting one or both potentially removable portions in the pair as being removable from the conductive power grid layer at least in part based on a directional relationship between the pair.

16. The system of claim 12, wherein:

the conductive lines extend in a first direction and are spaced apart from each other in a second direction transverse to the first direction, each of the plurality of conductive lines having two edges extending along the first direction; and the selecting a subset of the plurality of potentially removable portions as being removable from the conductive power grid layer comprises selecting at least one potentially removable portion along the first edge of at least one of the conductive lines and at least one potentially removable portion along the second edge of the at least one of the conductive lines as removable from the conductive power grid layer.

17. The system of claim 12, the method further comprising removing the removable portions of the layer to alter the received integrated circuit design prior to the outputting step.

18. The system of claim 17, further comprising a fabrication tool, the method further including fabricating, using the fabrication tool, an integrated circuit device according to the altered integrated circuit design.

* * * * *